United States Patent
Ichikawa et al.

(10) Patent No.: US 12,288,576 B2
(45) Date of Patent: Apr. 29, 2025

(54) MAGNETORESISTANCE EFFECT ELEMENT, MAGNETIC RECORDING ELEMENT, AND HIGH-FREQUENCY DEVICE

(71) Applicant: TDK CORPORATION, Tokyo (JP)

(72) Inventors: Shinto Ichikawa, Tokyo (JP); Kazuumi Inubushi, Tokyo (JP); Katsuyuki Nakada, Tokyo (JP)

(73) Assignee: TDK CORPORATION, Tokyo (JP)

( * ) Notice: Subject to any disclaimer, the term of this patent is extended or adjusted under 35 U.S.C. 154(b) by 37 days.

(21) Appl. No.: 18/373,642

(22) Filed: Sep. 27, 2023

(65) Prior Publication Data
US 2024/0112695 A1    Apr. 4, 2024

(30) Foreign Application Priority Data
Sep. 29, 2022   (JP) .................. 2022-156217

(51) Int. Cl.
*G11B 5/39* (2006.01)
*G01R 33/09* (2006.01)
(Continued)

(52) U.S. Cl.
CPC .......... *G11B 5/3906* (2013.01); *G11C 11/161* (2013.01); *H01F 10/16* (2013.01);
(Continued)

(58) Field of Classification Search
None
See application file for complete search history.

(56) References Cited

U.S. PATENT DOCUMENTS

| 6,876,522 B2 | 4/2005 | Ambrose et al. |
| 7,336,453 B2 | 2/2008 | Hasegawa et al. |
| (Continued) | | |

FOREIGN PATENT DOCUMENTS

| CN | 109560192 A | 4/2019 |
| JP | 2005-085286 A | 3/2005 |
| (Continued) | | |

OTHER PUBLICATIONS

Masayuki Takagishi et al. "Magnetoresistance Ratio and Resistance Area Design of CPP-MR Film For 2-5 Tb/in2 Read Sensors". IEEE Transactions on Magnetics, vol. 46, No. 6, Jun. 2010, pp. 2086-2089.

(Continued)

*Primary Examiner* — Kevin M Bernatz
(74) *Attorney, Agent, or Firm* — Oliff PLC

(57) ABSTRACT

A magnetoresistance effect element having a large MR ratio is provided.
This magnetoresistance effect element includes: a first ferromagnetic layer; a second ferromagnetic layer; and a nonmagnetic layer. The first ferromagnetic layer includes a first layer and a second layer. The first layer is closer to the nonmagnetic layer than the second layer. The first layer has a Heusler alloy containing at least partially crystallized Co. The second layer contains a material different from the Heusler alloy and has at least a partially crystallized ferromagnetic material. The first layer and the second layer have added first atoms. The first atom is any one selected from the group consisting of Mg, Al, Cr, Mn, Ni, Cu, Zn, Pd, Cd, In, Sn, Sb, Pt, Au, and Bi.

18 Claims, 9 Drawing Sheets

(51) Int. Cl.
  *G11C 11/16* (2006.01)
  *H01F 10/16* (2006.01)
  *H01F 10/193* (2006.01)
  *H01F 10/26* (2006.01)
  *H01F 10/32* (2006.01)
  *H03H 7/12* (2006.01)
  *H10B 61/00* (2023.01)

(52) U.S. Cl.
  CPC ......... *H01F 10/1936* (2013.01); *H01F 10/26* (2013.01); *G01R 33/091* (2013.01); *G01R 33/098* (2013.01); *H01F 10/3254* (2013.01); *H03H 7/12* (2013.01); *H10B 61/00* (2023.02)

(56) References Cited

U.S. PATENT DOCUMENTS

| | | | |
|---|---|---|---|
| 7,499,248 B2 * | 3/2009 | Ishizone | H10N 50/85 360/324.12 |
| 8,031,441 B2 | 10/2011 | Zhang et al. | |
| 8,064,244 B2 | 11/2011 | Zhang et al. | |
| 8,320,080 B1 | 11/2012 | Braganca et al. | |
| 9,087,980 B2 | 7/2015 | Daibou et al. | |
| 9,336,937 B2 | 5/2016 | Takahashi et al. | |
| 9,412,399 B2 | 8/2016 | Childress et al. | |
| 9,564,581 B1 | 2/2017 | Choi et al. | |
| 9,643,385 B1 | 5/2017 | Butler et al. | |
| 9,899,044 B2 | 2/2018 | Furubayashi et al. | |
| 10,020,445 B2 | 7/2018 | Inubushi et al. | |
| 10,388,347 B2 | 8/2019 | Matsumoto et al. | |
| 10,453,482 B2 | 10/2019 | Inubushi et al. | |
| 10,505,105 B2 | 12/2019 | Inubushi et al. | |
| 10,559,749 B2 | 2/2020 | Inubushi et al. | |
| 10,755,733 B1 | 8/2020 | Zheng et al. | |
| 10,777,247 B1 | 9/2020 | Sun | |
| 10,804,671 B1 | 10/2020 | Kirchner et al. | |
| 10,937,451 B2 | 3/2021 | Inubushi et al. | |
| 10,937,954 B2 | 3/2021 | Inubushi et al. | |
| 11,004,465 B2 | 5/2021 | Kasai et al. | |
| 11,107,908 B2 | 8/2021 | Manipatruni et al. | |
| 11,170,803 B1 | 11/2021 | Liu et al. | |
| 11,309,115 B2 | 4/2022 | Nakada | |
| 11,335,365 B2 | 5/2022 | Inubushi et al. | |
| 11,362,269 B2 | 6/2022 | Cai et al. | |
| 11,410,689 B2 | 8/2022 | Inubushi et al. | |
| 11,525,873 B2 | 12/2022 | Ichikawa et al. | |
| 11,581,365 B2 | 2/2023 | Nakada et al. | |
| 11,694,714 B2 | 7/2023 | Inubushi et al. | |
| 11,730,063 B2 | 8/2023 | Inubushi et al. | |
| 11,769,523 B2 | 9/2023 | Inubushi et al. | |
| 11,967,348 B2 | 4/2024 | Nakada et al. | |
| 12,040,115 B1 * | 7/2024 | Inubushi | G01R 33/091 |
| 2002/0000575 A1 | 1/2002 | Sato et al. | |
| 2002/0159203 A1 | 10/2002 | Saito et al. | |
| 2003/0168673 A1 | 9/2003 | Yuasa et al. | |
| 2006/0114619 A1 | 6/2006 | Sbiaa et al. | |
| 2006/0183002 A1 | 8/2006 | Yang et al. | |
| 2006/0215330 A1 | 9/2006 | Ide et al. | |
| 2006/0262460 A1 | 11/2006 | Ide et al. | |
| 2007/0201169 A1 * | 8/2007 | Ide | H01F 10/3277 360/324.11 |
| 2007/0217087 A1 | 9/2007 | Hirata | H10N 50/85 257/E27.005 |
| 2007/0230070 A1 | 10/2007 | Mizuno et al. | |
| 2007/0274010 A1 * | 11/2007 | Hirata | B82Y 25/00 360/324.11 |
| 2008/0052896 A1 * | 3/2008 | Tsuchiya | H10N 50/01 29/603.01 |
| 2008/0100969 A1 | 5/2008 | Mizuno et al. | |
| 2008/0268290 A1 | 10/2008 | Carey et al. | |
| 2008/0278864 A1 | 11/2008 | Zhang et al. | |
| 2009/0141410 A1 | 6/2009 | Jogo et al. | |
| 2009/0168266 A1 | 7/2009 | Sato et al. | |
| 2009/0168269 A1 | 7/2009 | Carey et al. | |
| 2009/0268353 A1 | 10/2009 | Carey et al. | |
| 2010/0072529 A1 | 3/2010 | Marukame et al. | |
| 2010/0103565 A1 | 4/2010 | Lou | |
| 2010/0149863 A1 | 6/2010 | Lee et al. | |
| 2010/0157465 A1 * | 6/2010 | Sakamoto | G11B 5/3929 360/75 |
| 2010/0188771 A1 * | 7/2010 | Okamura | H01F 10/3268 360/75 |
| 2011/0043950 A1 | 2/2011 | Carey et al. | |
| 2011/0089940 A1 | 4/2011 | Carey et al. | |
| 2011/0129691 A1 | 6/2011 | Ishiwata et al. | |
| 2011/0207240 A1 | 8/2011 | Lim et al. | |
| 2012/0009337 A1 | 1/2012 | Zhang et al. | |
| 2012/0241881 A1 | 9/2012 | Daibou et al. | |
| 2013/0014798 A1 | 1/2013 | Nishide et al. | |
| 2013/0236639 A1 | 9/2013 | Carey et al. | |
| 2013/0236744 A1 * | 9/2013 | Brinkman | G11B 5/3906 428/811.2 |
| 2013/0242435 A1 | 9/2013 | Fuji et al. | |
| 2013/0302649 A1 | 11/2013 | Takahashi et al. | |
| 2013/0313506 A1 | 11/2013 | Murayama et al. | |
| 2014/0063648 A1 | 3/2014 | Shiroishi et al. | |
| 2015/0010780 A1 * | 1/2015 | Carey | G11B 5/3929 428/811.3 |
| 2015/0078070 A1 | 3/2015 | Quinsat et al. | |
| 2015/0116867 A1 | 4/2015 | Childress et al. | |
| 2015/0311305 A1 | 10/2015 | Ishikawa et al. | |
| 2016/0019917 A1 | 1/2016 | Du et al. | |
| 2016/0380185 A1 | 12/2016 | Kato et al. | |
| 2017/0077394 A1 | 3/2017 | Saida | |
| 2017/0092307 A1 | 3/2017 | Du et al. | |
| 2017/0221507 A1 | 8/2017 | Furubayashi et al. | |
| 2017/0221577 A1 | 8/2017 | Choe | |
| 2017/0229643 A1 | 8/2017 | Chen et al. | |
| 2018/0226573 A1 | 8/2018 | Chen et al. | |
| 2018/0243691 A1 | 8/2018 | Mueller et al. | |
| 2018/0254409 A1 | 9/2018 | Nakada et al. | |
| 2018/0301611 A1 | 10/2018 | Fukatani et al. | |
| 2018/0301621 A1 | 10/2018 | Sato et al. | |
| 2018/0342668 A1 | 11/2018 | Inubushi et al. | |
| 2019/0019942 A1 | 1/2019 | Nakada et al. | |
| 2019/0074430 A1 | 3/2019 | Shiokawa et al. | |
| 2019/0088395 A1 | 3/2019 | Ota et al. | |
| 2019/0094315 A1 | 3/2019 | Inubushi et al. | |
| 2019/0109277 A1 | 4/2019 | Jan et al. | |
| 2019/0164587 A1 | 5/2019 | Machida et al. | |
| 2019/0189172 A1 | 6/2019 | Higo et al. | |
| 2019/0355898 A1 | 11/2019 | Nakada | |
| 2020/0051724 A1 | 2/2020 | Doyle et al. | |
| 2020/0158796 A1 | 5/2020 | Ikhtiar et al. | |
| 2020/0266336 A1 | 8/2020 | Nakada et al. | |
| 2020/0321393 A1 | 10/2020 | Manipatruni et al. | |
| 2020/0403149 A1 | 12/2020 | Guisan et al. | |
| 2021/0043225 A1 | 2/2021 | Inubushi et al. | |
| 2021/0043226 A1 | 2/2021 | Inubushi et al. | |
| 2021/0043682 A1 | 2/2021 | Nakada et al. | |
| 2021/0193913 A1 * | 6/2021 | Ichikawa | H10N 50/85 |
| 2021/0265562 A1 | 8/2021 | Ichikawa et al. | |
| 2021/0286028 A1 | 9/2021 | Ichikawa et al. | |
| 2022/0130901 A1 | 4/2022 | Sonobe et al. | |
| 2023/0144429 A1 | 5/2023 | Ichikawa et al. | |
| 2023/0210016 A1 | 6/2023 | Ichikawa et al. | |
| 2023/0292625 A1 * | 9/2023 | Nakada | G01R 33/093 |
| 2023/0337549 A1 | 10/2023 | Inubushi et al. | |
| 2024/0099152 A1 * | 3/2024 | Inubushi | H10N 50/10 |
| 2024/0112695 A1 | 4/2024 | Ichikawa et al. | |

FOREIGN PATENT DOCUMENTS

| | | |
|---|---|---|
| JP | 2007-250977 A | 9/2007 |
| JP | 2007-273657 A | 10/2007 |
| JP | 2007-324269 A | 12/2007 |
| JP | 2008-112841 A | 5/2008 |
| JP | 2010-141340 A | 6/2010 |
| JP | 2010-146650 A | 7/2010 |
| JP | 2012-190914 A | 10/2012 |
| JP | 2013-247198 A | 12/2013 |
| JP | 2014-049145 A | 3/2014 |
| JP | 5441005 B2 | 3/2014 |

(56) References Cited

FOREIGN PATENT DOCUMENTS

| | | |
|---|---|---|
| JP | 2015-060609 A | 3/2015 |
| JP | 6137577 B2 | 5/2017 |
| JP | 2017-097935 A | 6/2017 |
| JP | 2017-103419 A | 6/2017 |
| JP | 6204769 B2 | 9/2017 |
| JP | 2019-021751 A | 2/2019 |
| JP | 2019-046976 A | 3/2019 |
| JP | 2019-047120 A | 3/2019 |
| JP | 2019-062060 A | 4/2019 |
| JP | 2019-201095 A | 11/2019 |
| JP | 2021-125551 A | 8/2021 |
| WO | 2016/017612 A1 | 2/2016 |
| WO | 2017/208653 A1 | 12/2017 |

OTHER PUBLICATIONS

Hari S. Goripati et al. "Bi-Quadratic Interlayer Exchange Coupling in Co2MnSi/Ag/Co2MnSi Pseudo Spin-Valve". Journal of Applied Physics, vol. 110, 2011, pp. 123914-1 through 123914-7.

T. Furubayashi et al. "Structure and Transport Properties of Current-Perpendicular-To-Plane Spin Valves Using Co2FeAl0.5Si0.5 and Co2MnSi Heusler Alloy Electrodes". Journal of Applied Physics, vol. 107, 2010, pp. 113917-1 through 113917-7.

Taku Iwase et al. "Large Interface Spin-Asymmetry and Magnetoresistance in Fully Epitaxial Co2MnSi/Ag/Co2MnSi Current-Perpendicular-To-Plane Magnetoresistive Devices". Applied Physics Express, vol. 2, 2009, vol. 063003-1 through 063003-3.

Dec. 21, 2020 Search Report issued in European Patent Application No. 20189919.2.

Nov. 4, 2021 Office Action issued in U.S. Appl. No. 16/984,381.

Dec. 19, 2022 Office Action Issued in U.S. Appl. No. 17/853,429.

Translation of Apr. 27, 2023 Office Action issued in Chinese Application No. 202010777761.3.

Nov. 9, 2023 Office Action issued in European Patent Application No. 20189919.2.

Wang et al., J. App. Phys., 112, 124314, 2012, 9 total pages (Year: 2012).

Apr. 24, 2024 Office Action issued in U.S. Appl. No. 18/240,657.

Mar. 12, 2024 Office Action issued in U.S. Appl. No. 17/981,112.

Nov. 30, 2022 Office Action issued in U.S. Appl. No. 17/115,283.

Mar. 23, 2023 Notice of Allowance issued in U.S. Appl. No. 17/115,283.

Sep. 12, 2019 International Preliminary Report on Patentability issued in International Patent Application No. PCT/JP2018/001187.

Qiu et al. "The influence of oxygen on structure and magnetic properties of full Heusler CO2MnAl films and magentic tunnel junctions." J Appl. Phys., 105, 07C932, Apr. 3, 2009.

Shinohara et al. "Methods to induce perpendicular magnetic anisotropy in full-Heusler Co2FeSi thin layers in a magentic tunnel junction structure." AIP Advances, 8, 055923, Jan. 17, 2018.

Wen et al.; "Fully expitaxial C1b-type NiMnSb half-Heusler alloy films for current-perpendicular-to-plane giant magnetoresistance devices with a Ag spacer"; Scientific Reports; vol. 5, 18387; 2015; pp. 1-10.

Kasai et al.; "Large magnetoresistance in Heusler-alloy-based expitaxial magnetic junctions with semiconducting Cu (In0.8Ga0.2)Se2 spacer"; vol. 109, 032409; 2016 pp. 032409-1-032409-4.

Galanakis et al.; "Electronic structure and Slater-Pauling behavior in half-metallic Heusler alloys calculated from first principles"; Journal of Physics D: Applied Physics; vol. 39 765; 2006; pp. 765-775.

Kwon et al.; "Anisotropic magnetoresistance and current-perpendicular-to-plane giant magnetoresistance in expitaxial NiMnSb-based multilayers"; Journal of Applied Physics; vol. 119, 023902; 2016; pp. 023902-1-023902-6.

Yoshio Miura et al.; "First-principles study of ballistic transport properties in Co2MnSi/X/Co2MnSi(001) (X=Ag, Au, Al, V, Cr) trilayers;" Physical Review B; vol. 84; 134432-1-134432-6; 2011.

Mar. 29, 2021 Search Report issued in European Patent Application No. 20189904.4.

Mar. 30, 2022 Office Action issued in U.S. Appl. No. 16/986,431.

Feb. 4, 2021 Ex Parte Quayle Action issued in U.S. Appl. No. 16/984,389.

Jul. 9, 2021 Office Action issued in U.S. Appl. No. 16/984,389.

Oct. 6, 2022 Office Action issued in U.S. Appl. No. 17/714,237.

Translation of Apr. 23, 2023 Office Action issued in Chinese Patent Application No. 202010784298.5.

Aug. 31, 2023 Office Action issued in U.S. Appl. No. 17/124,643.

Guchang Han et al., "Control of offset field and pinning stability in perpendicular magnetic tunnelling junctions with synthetic antiferromagnetic coupling multilayer", Journal of Applied Physics, vol. 117, 17B515 (2015).

Mar. 16, 2021 Search Report issued in International Patent Application No. PCT/JP2020/047677.

Nov. 15, 2022 Office Action issued in U.S. Appl. No. 17/141,347.

Aug. 7, 2024 Notice of Allowance issued in U.S. Appl. No. 17/981,112.

Jan. 9, 2019 Office Action issued in U.S. Appl. No. 15/988,707.

Apr. 23, 2019 Office Action issued in U.S. Appl. No. 15/988,707.

Jun. 12, 2019 Notice of Allowance issued in U.S. Appl. No. 15/988,707.

May 17, 2019 Office Action issued in U.S. Appl. No. 16/081,192.

Aug. 28, 2019 Office Action issued in U.S. Appl. No. 16/081,192.

Nov. 4, 2019 Notice of Allowance issued in U.S. Appl. No. 16/081,192.

Sep. 12, 2019 International Preliminary Report on Patentability issued in Application No. PCT/JP2018/001423.

May 14, 2019 Office Action issued in U.S. Appl. No. 16/081,357.

Aug. 1, 2019 Notice of Allowance issued in U.S. Appl. No. 16/081,357.

Aug. 27, 2020 Office Action issued in U.S. Appl. No. 16/676,920.

Nov. 16, 2020 Notice of Allowance issued in U.S. Appl. No. 16/676,920.

Aug. 25, 2021 Office Action issued in U.S. Appl. No. 16/777,036.

Jan. 13, 2022 Notice of Allowance issued in U.S. Appl. No. 16/777,036.

Aug. 4, 2020 Office Action issued in U.S. Appl. No. 16/817,690.

Nov. 16, 2020 Notice of Allowance issued in U.S. Appl. No. 16/817,690.

Jan. 13, 2022 Notice of Allowance issued in U.S. Appl. No. 16/984,389.

Aug. 4, 2022 Office Action issued in U.S. Appl. No. 16/986,431.

Choi et al., "Enhancement of current-perpendicular-to-plane giant magnetoresistance by insertion of amorphous ferromagnetic underlayer in Heusler alloy-based spin-valve structures," Applied Physics Express, 2017, vol. 10, pp. 013006-1-013006-4.

Goripati et al., "Bi-quadratic interlayer exchange coupling in Co2MnSi/Ag/Co2MnSi pseudo spin-valve," Journal of Applied Physics, 2011, vol. 110, pp. 123914-1-123914-7.

Furubayashi et al., "Structure and transport properties of current-perpendicular-to-plane spin valves using Co2FeAl0.5Si0.5 and Co2MnSi Heusler alloy electrodes," Journal of Applied Physics, 2010, vol. 107, pp. 113917-1-113917-7.

Iwase et al., "Large Interface Spin-Assymetry and Magnetoresistance in Fully Epitaxial Co2MnSi/Ag/Co2MnSi Current-Perpendicular-to-Plane Magnetoresistive Devices," Applied Physics Express, 2009, vol. 2, pp. 063003-1-063003-3.

Jung et al., "Enhancement of magnetoresistance by inserting thin NiAl layers at the interfaces in Co2FeGa0.5Ge0.5/Ag/Co2FeGa0.5Ge0.5 current-perpendicular-to-plane pseudo spin valves," Applied Physics Letters, 2016, vol. 108, pp. 102408-1-102408-5.

Nov. 9, 2022 Notice of Allowance issued in U.S. Appl. No. 16/986,431.

Feb. 7, 2023 Notice of Allowance issued in U.S. Appl. No. 17/714,237.

Nov. 9, 2023 Office Action issued in U.S. Appl. No. 18/019,919.

Feb. 7, 2024 Notice of Allowance issued in U.S. Appl. No. 18/019,919.

U.S. Appl. No. 18/240,657, filed Aug. 31, 2023 in the name of Inubushi et al.

(56) References Cited

OTHER PUBLICATIONS

Sep. 20, 2024 Notice of Allowance received in U.S. Appl. No. 18/240,657.

* cited by examiner

MAGNETORESISTANCE EFFECT ELEMENT, MAGNETIC RECORDING ELEMENT, AND HIGH-FREQUENCY DEVICE

BACKGROUND

Field

The present disclosure relates to a magnetoresistance effect element, a magnetic recording element, and a high-frequency device. Priority is claimed on Japanese Patent Application No. 2022-156217, filed Sep. 29, 2022, the content of which is incorporated herein by reference.

Description of Related Art

A magnetoresistance effect element is an element of which a resistance value in a lamination direction changes due to a magnetoresistance effect. The magnetoresistance effect element includes two ferromagnetic layers and a nonmagnetic layer sandwiched between them. A magnetoresistance effect element using a conductor for a nonmagnetic layer is called a giant magnetoresistance (GMR) element and a magnetoresistance effect element using an insulating layer (tunnel barrier layer, barrier layer) for a nonmagnetic layer is called a tunnel magnetoresistance (TMR) element. The magnetoresistance effect element can be applied to various applications such as magnetic sensors, high-frequency components, magnetic heads, and nonvolatile random-access memories (MRAM).

Patent Document 1 describes a magnetic sensor including a magnetoresistance effect element using a Heusler alloy for a ferromagnetic layer. The Heusler alloy has high spin polarization. The magnetic sensor containing a Heusler alloy is expected to have a large output signal. On the other hand, Patent Document 1 describes that a Heusler alloy is less likely to crystallize unless the Heusler alloy is formed at a high temperature or on a thick underlying substrate having a predetermined crystallinity. Further, Patent Document 1 describes that the film formation at the high temperature or the thick underlying substrate can cause a decrease in the output of the magnetic sensor. Patent Document 1 describes that the output of the magnetic sensor can be increased by avoiding such a treatment and making a ferromagnetic layer into a lamination structure of an amorphous layer and a crystalline layer.

PATENT DOCUMENT

[Patent Document 1] U.S. Pat. No. 9,412,399

SUMMARY

The magnitude of the output signal of the magnetic sensor depends on the magnetoresistance change rate (MR ratio) of the magnetoresistance effect element. In general, the MR ratio tends to increase as the crystallinity of the ferromagnetic layers sandwiching the nonmagnetic layer increases. There is a demand for a magnetoresistance effect element that can easily crystallize a Heusler alloy without using a high-temperature film formation or a thick underlying substrate having a predetermined crystallinity and that has a large MR ratio. In the magnetoresistance effect element described in Patent Document 1, the ferromagnetic layer contacting the nonmagnetic layer is amorphous and a sufficiently large MR ratio is not easily obtained.

The present disclosure has been made in view of the above-described circumstances and an object thereof is to provide a magnetoresistance effect element capable of realizing a large MR ratio.

The present disclosure provides the following means in order to solve the above-described problems.

(1) A magnetoresistance effect element according to a first aspect includes: a first ferromagnetic layer; a second ferromagnetic layer; and a nonmagnetic layer. The first ferromagnetic layer includes a first layer and a second layer. The first layer is closer to the nonmagnetic layer than the second layer. The first layer has a Heusler alloy containing at least partially crystallized Co. The second layer contains a material different from the Heusler alloy and has at least a partially crystallized ferromagnetic material. The first layer and the second layer have added first atoms. The first atom is any one selected from the group consisting of Mg, Al, Cr, Mn, Ni, Cu, Zn, Pd, Cd, In, Sn, Sb, Pt, Au, and Bi.

(2) In the magnetoresistance effect element according to the above-described aspect, the second ferromagnetic layer may include a third layer and a fourth layer. The third layer is closer to the nonmagnetic layer than the fourth layer. The third layer has a Heusler alloy containing at least partially crystallized Co. The fourth layer contains a material different from the Heusler alloy and has at least a partially crystallized ferromagnetic material. The third layer and the fourth layer have the first atoms.

(3) In the magnetoresistance effect element according to the above-described aspect, the first ferromagnetic layer may further include a fifth layer. The first layer and the fifth layer sandwich the second layer. The fifth layer has the Heusler alloy.

(4) In the magnetoresistance effect element according to the above-described aspect, the ferromagnetic material may be represented by $Co_xFe_{1-x}A$. x is 0 or more and 1 or less and A is the first atom.

(5) In the magnetoresistance effect element according to the above-described aspect, a crystal structure of the ferromagnetic material is a bcc structure or fcc structure.

(6) In the magnetoresistance effect element according to the above-described aspect, the first layer and the second layer may be close to each other. In this case, the first layer and the second layer are lattice-matched and a lattice constant of the first layer is 95% or more and 105% or less of a lattice constant of the second layer when the lattice constant of the second layer is used as a reference.

(7) In the magnetoresistance effect element according to the above-described aspect, a first surface of the first layer on the side of the nonmagnetic layer may have a lower concentration of the first atoms than a second surface on the side opposite to the first surface.

(8) In the magnetoresistance effect element according to the above-described aspect, a concentration of the first atoms in the first layer may be lower than a concentration of the first atoms in the second layer.

(9) In the magnetoresistance effect element according to the above-described aspect, a crystal structure of the Heusler alloy may be an $L2_1$ structure or B2 structure.

(10) In the magnetoresistance effect element according to the above-described aspect, a Co composition ratio of the Heusler alloy may be less than the stoichiometric composition ratio. The Heusler alloy is represented by CoYZ or $CO_2YZ$ in stoichiometric composition. Y is a transition metal of a Mn, V, Cr, or Ti group, a transition metal element of a Co, Fe, Ni, or Cu group, or a noble metal element. Z is a typical element of group III to group V.

(11) In the magnetoresistance effect element according to the above-described aspect, the Heusler alloy may be represented by $CO_2Y_\alpha Z_\beta$ in composition formula. The Y is one or more elements selected from the group consisting of Fe, Mn, and Cr, the Z is one or more elements selected from the group consisting of Si, Al, Ga, and Ge, and $\alpha+\beta>2$ is satisfied.

(12) In the magnetoresistance effect element according to the above-described aspect, the first atom may be substituted with a part of a crystal structure of the Heusler alloy.

(13) The magnetoresistance effect element according to the above-described aspect may further include: a NiAl alloy layer which is located in at least one of a position between the first ferromagnetic layer and the nonmagnetic layer and a position between the second ferromagnetic layer and the nonmagnetic layer.

(14) In the magnetoresistance effect element according to the above-described aspect, the NiAl alloy layer may have a thickness of 0.63 nm or less.

(15) In the magnetoresistance effect element according to the above-described aspect, the nonmagnetic layer may be a metal or alloy containing any element selected from the group consisting of Cu, Au, Ag, Al, and Cr.

(16) The magnetoresistance effect element according to the above-described aspect may further include: a substrate. The substrate is a base on which the first ferromagnetic layer, the second ferromagnetic layer, and the nonmagnetic layer are laminated, and the substrate is amorphous.

The magnetoresistance effect element according to the present disclosure exhibits a large MR ratio.

DETAILED DESCRIPTION

Figure 1:
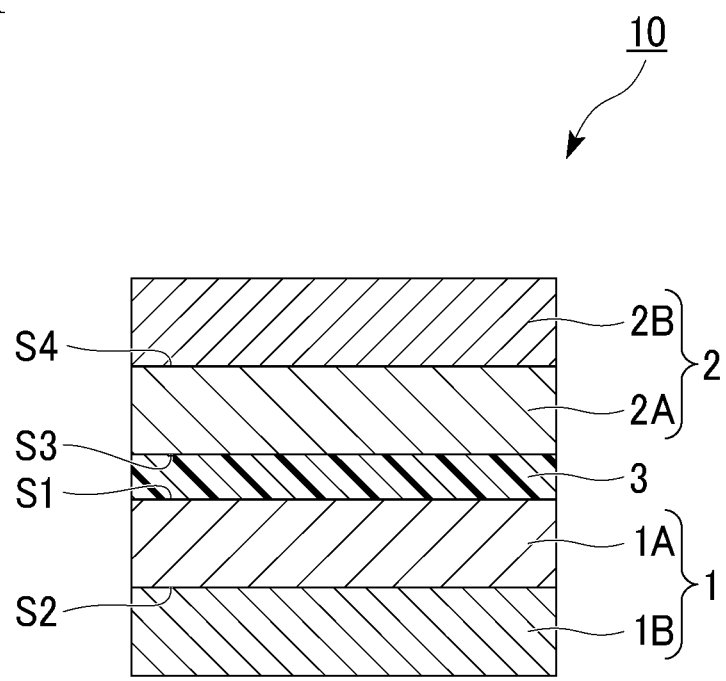
FIG. 1 is a cross-sectional view of a magnetoresistance effect element according to a first embodiment.

Hereinafter, this embodiment will be described in detail with reference to appropriate drawings. In the drawings used in the following description, in order to easily understand the features of this embodiment, there are cases where the featured parts are enlarged for convenience and the dimensional ratio of each component may be different from the actual ones. The materials, dimensions, and the like exemplified in the following description are examples, and the present disclosure is not limited to them and can be modified as appropriate without changing the gist of the disclosure.

First Embodiment

FIG. 1 is a cross-sectional view of a magnetoresistance effect element according to a first embodiment. First, directions will be defined. The direction in which each layer is laminated may be referred to as a lamination direction. Also, the direction in which each layer spreads perpendicular to the lamination direction may be referred to as an in-plane direction.

A magnetoresistance effect element 10 shown in FIG. 1 includes a first ferromagnetic layer 1, a second ferromagnetic layer 2, and a nonmagnetic layer 3. The nonmagnetic layer 3 is between the first ferromagnetic layer 1 and the second ferromagnetic layer 2.

The magnetoresistance effect element 10 outputs changes in relative angle between the magnetization of the first ferromagnetic layer 1 and the magnetization of the second ferromagnetic layer 2 as changes in resistance or output voltage. The magnetization of the second ferromagnetic layer 2 is, for example, more rotate than the magnetization of the first ferromagnetic layer 1. When a predetermined external force is applied, the magnetization direction of the first ferromagnetic layer 1 does not change (fixed), and the magnetization direction of the second ferromagnetic layer 2 changes. As the magnetization direction of the second ferromagnetic layer 2 changes with respect to the magnetization direction of the first ferromagnetic layer 1, the resistance value of the magnetoresistance effect element 10 changes. In this case, the first ferromagnetic layer 1 may be called a magnetization fixed layer and the second ferromagnetic layer 2 may be called a magnetization free layer. Hereinafter, it will be described such that the first ferromagnetic layer 1 is the magnetization fixed layer and the second ferromagnetic layer 2 is the magnetization free layer, but this relationship may be reversed.

A difference in easiness of movement between the magnetization of the first ferromagnetic layer 1 and the magnetization of the second ferromagnetic layer 2 when a predetermined external force is applied is caused by a difference in coercive force between the first ferromagnetic layer 1 and the second ferromagnetic layer 2. For example, when the thickness of the second ferromagnetic layer 2 is thinner than the thickness of the first ferromagnetic layer 1, the coercive force of the second ferromagnetic layer 2 is often smaller than the coercive force of the first ferromagnetic layer 1. Further, for example, an antiferromagnetic layer may be arranged on the surface of the first ferromagnetic layer 1 on the side opposite to the nonmagnetic layer 3 via a spacer layer. The first ferromagnetic layer 1, the spacer layer, and the antiferromagnetic layer form a synthetic antiferromagnetic structure (SAF structure). The synthetic antiferromagnetic structure consists of two magnetic layers and the spacer layer sandwiched between the two magnetic layers. When the first ferromagnetic layer 1 and the antiferromagnetic layer are antiferromagnetically coupled, the coercive force of the first ferromagnetic layer 1 becomes larger than when there is no antiferromagnetic layer and no antiferromagnetic coupling. The antiferromagnetic layer is, for example, IrMn, PtMn, or the like. The spacer layer contains, for example, at least one selected from the group consisting of Ru, Ir, and Rh.

The first ferromagnetic layer 1 contains a ferromagnetic material. The first ferromagnetic layer 1 includes a first layer 1A and a second layer 1B. The first layer 1A is closer to the nonmagnetic layer 3 than the second layer 1B.

The first layer 1A contains a Heusler alloy containing Co. The first layer 1A may be made of a Heusler alloy containing Co. The Heusler alloy is at least partially crystallized. The Heusler alloy may, for example, be entirely crystallized.

It is possible to determine whether or not the Heusler alloy is crystallized by a transmission electron microscope (TEM) image (for example, a high-angle scattering annular dark field scanning transmission microscope image: HAADF-STEM image) or an electron diffraction image using a transmission electron beam. If the Heusler alloy is crystallized, it can be confirmed that the atoms are arranged regularly, for example, in the HAADF-STEM image. More specifically, spots derived from the crystal structure of the Heusler alloy appear in the Fourier transform image of the HAADF-STEM image. Further, when the Heusler alloy is crystallized, diffraction spots from at least one of the (001) plane, (002) plane, (110) plane, (111) plane, and (011) plane can be confirmed in the electron beam diffraction image. When crystallization can be confirmed by at least one means, it can be said that at least a part of the Heusler alloy is crystallized.

The Heusler alloy, for example, is mainly oriented in the (001) or (011) direction (also referred to as main orientation). Mainly oriented in the (001) or (011) direction means that the main crystal direction of crystals constituting the Heusler alloy is the (001) or (011) direction. For example, when the Heusler alloy consists of multiple crystal grains, the crystal direction of each crystal grain may be different. In this case, when the direction of the synthetic vector of the crystal orientation directions in arbitrary 50 crystal grains is within a range of inclination of 25° or less with respect to the (001) direction, it can be said that the main orientation is in the (001) direction. The same applies to the (011) direction. The Heusler alloy in which the orientation directions of the constituent crystals are aligned has high crystallinity, and the MR ratio of the magnetoresistance effect element 10 containing this Heusler alloy is high. Further, the (001) direction includes an orientation direction that is considered equivalent to the (001) direction. That is, the (001) orientation includes (001) orientation, (010) orientation, (100) orientation, and all orientation directions opposite thereto.

The Heusler alloy is an intermetallic compound with a chemical composition of XYZ or $X_2YZ$. A ferromagnetic Heusler alloy represented by $X_2YZ$ is called a full-Heusler alloy, and a ferromagnetic Heusler alloy represented by XYZ is called a half-Heusler alloy. The half-Heusler alloy is the full-Heusler alloy in which some of the X-site atoms are vacant. Both full-Heusler alloys and half-Heusler alloys are typically intermetallic compounds based on the bcc structure.

FIG. 2 is an example of the crystal structure of the Heusler alloy. FIGS. 2A to 2C are examples of crystal structures of full-Heusler alloys, and FIGS. 2D to 2F are examples of crystal structures of half-Heusler alloys.

Figure 2A:
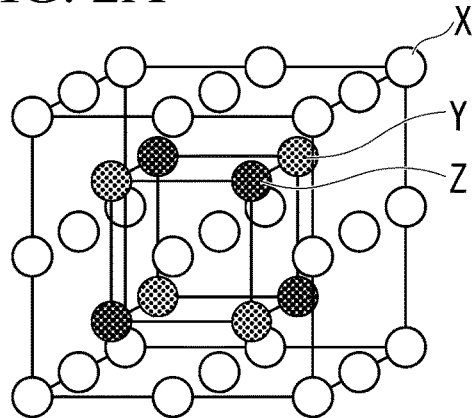
FIG. 2A is a diagram showing a crystal structure of a Heusler alloy.

FIG. 2A is referred to as an $L2_1$ structure. In the $L2_1$ structure, an element entering the X site, an element entering the Y site, and an element entering the Z site are fixed. FIG. 2B is referred to as a B2 structure derived from the $L2_1$ structure. In the B2 structure, an element entering the Y site and an element entering the Z site are mixed, and an element entering the X site is fixed. FIG. 2C is referred to as an A2 structure derived from the $L2_1$ structure. In the A2 structure, an element entering the X site, an element entering the Y site, and an element entering the Z site are mixed.

Figure 2D:
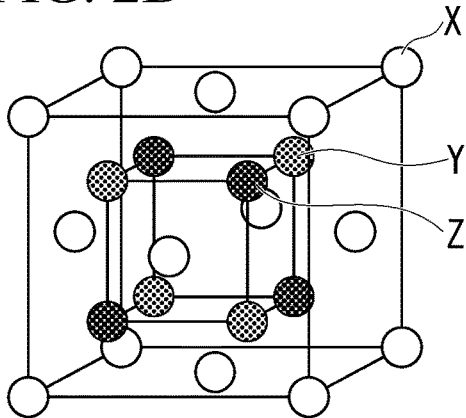
FIG. 2D is a diagram showing a crystal structure of a Heusler alloy.
Figure 2B:
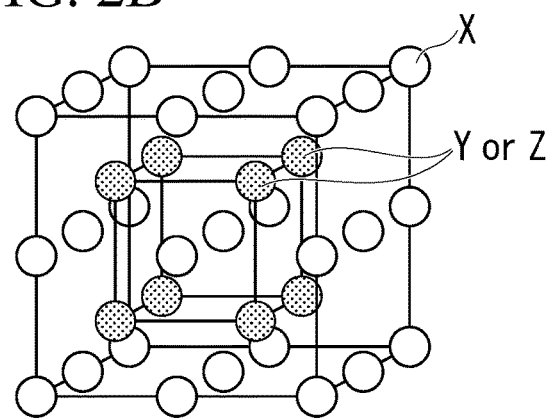
FIG. 2B is a diagram showing a crystal structure of a Heusler alloy.
Figure 2E:
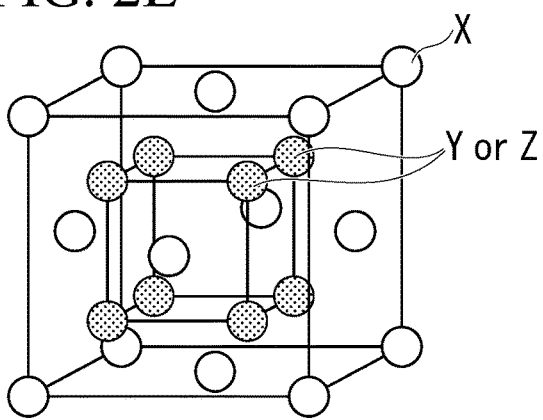
FIG. 2E is a diagram showing a crystal structure of a Heusler alloy.
Figure 2C:
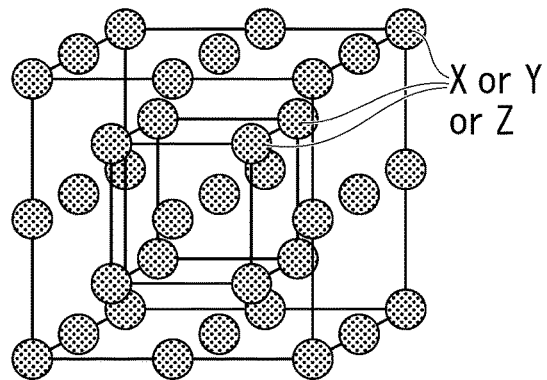
FIG. 2C is a diagram showing a crystal structure of a Heusler alloy.
Figure 2F:
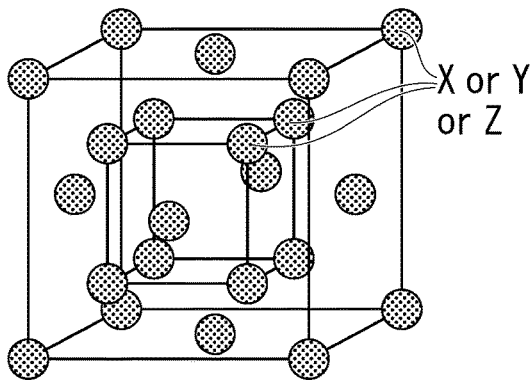
FIG. 2F is a diagram showing a crystal structure of a Heusler alloy.

FIG. 2D is referred to as a $C1_b$ structure. In the $C1_b$ structure, an element entering the X site, an element entering the Y site, and an element entering the Z site are fixed. FIG. 2E is referred to as a B2 structure derived from the $C1_b$ structure. In the B2 structure, an element entering the Y site and an element entering the Z site are mixed, and an element entering the X site is fixed. FIG. 2F is referred to as an A2 structure derived from the $C1_b$ structure. In the A2 structure, an element entering the X site, an element entering the Y site, and an element entering the Z site are mixed.

In the full-Heusler alloy, the crystallinity is higher in the order of $L2_1$ structure>B2 structure>A2 structure, and in the half-Heusler alloy, the crystallinity is higher in the order of $C1_b$ structure>B2 structure>A2 structure. These crystal structures differ in the degree of crystallinity, but they are all crystals. The first layer 1A has, for example, one of the crystal structures described above. The crystal structure of the Heusler alloy is, for example, the $L2_1$ structure or the B2 structure, and the crystal structure of the first layer 1A is, for example, the $L2_1$ structure or the B2 structure.

Here, X is a transition metal element or noble metal element of a Co, Fe, Ni, or Cu group on the periodic table, Y is a transition metal of a Mn, V, Cr, or Ti group or an element species of X, and Z is a typical element of group III to group V. If the Heusler alloy contains Co, X is Co. Y is, for example, one or more elements selected from the group consisting of Fe, Mn, and Cr, and Z is, for example, one or more elements selected from the group consisting of Si, Al, Ga, and Ge.

The Heusler alloy containing Co is a Heusler alloy in which the X site is Co. The Heusler alloy containing Co is represented, for example, by $CoY_\alpha Z_\beta$ or $Co_2Y_\alpha Z_\beta$. A stoichiometric Co-based full Heusler alloy is represented by $Co_2YZ$. A stoichiometric Co-based half Heusler alloy is represented by $CoYZ$.

The Co composition ratio of the Heusler alloy is preferably less than the stoichiometric composition ratio. That is, when the Co-based Heusler alloy is a full Heusler alloy, it is preferable to satisfy $\alpha+\beta>2$. At this time, $\alpha$ satisfies $0.3<\alpha<2.1$, more preferably, $0.4<\alpha<2.0$, and $\beta$ satisfies $0.1\leq\beta\leq 2.0$. When the Co-based Heusler alloy is a half-Heusler alloy, it is preferable to satisfy $\alpha+\beta>1$. At this time, $\alpha$ satisfies $0.3<\alpha<2.1$, more preferably, $0.4<\alpha<2.0$, and $\beta$ satisfies $0.1\leq\beta\leq 2.0$.

When the Co composition ratio is relatively smaller than the Y-site element, it is possible to avoid the anti-site where the Y-site element is substituted with the X-site element (the site where Co enters). The anti-site fluctuates the Fermi level in Heusler alloy. When the Fermi level fluctuates, the half-metallicity of the Heusler alloy is reduced and the spin polarization is reduced. A decrease in spin polarization causes a decrease in the MR ratio of the magnetoresistance effect element 10.

The full-Heusler alloy containing Co is, for example, $Co_2FeSi$, $Co_2FeAl$, $Co_2FeGe_xGa_{1-x}$, $Co_2MnGe_xGa_{1-x}$, $Co_2MnSi$, $Co_2MnGe$, $Co_2MnGa$, $Co_2MnSn$, $Co_2MnAl$, $Co_2CrAl$, $Co_2VAl$, $Co_2Mn_{1-a}Fe_aAl_bSi_{1-b}$, or the like. The half-Heusler alloy containing Co is, for example, CoFeSb or CoMnSb.

The first layer 1A contains a first atom. The first atom is an atom added in the first layer 1A. The first atom is any one selected from the group consisting of Mg, Al, Cr, Mn, Ni, Cu, Zn, Pd, Cd, In, Sn, Sb, Pt, Au, and Bi. The first atom is preferably any one selected from the group consisting of Al, Cr, Mn, Ni, Cu, Zn, Pd, Sn, Sb, Pt, Au, and Bi, more preferably any one selected from the group consisting of Cr, Mn, Ni, Cu, Zn, and Pd, further preferably any one selected from the group consisting of Mn, Ni, Cu, and Zn, and particularly preferably Zn. Since the first atom moves in the first layer 1A at the time of manufacture, crystallization of the first layer 1A is promoted.

The first layer 1A may contain additional atoms other than the first atom. That is, the first layer 1A may contain one or more atoms selected from the group consisting of Mg, Al, Cr, Mn, Ni, Cu, Zn, Pd, Cd, In, Sn, Sb, Pt, Au, and Bi.

The first atom may enter between the crystal lattices of the Heusler alloy or may be substituted with any atom that constitutes the crystal structure of the Heusler alloy. In addition, a part of the first atoms may enter between the crystal lattices of the Heusler alloy, and the remaining part may be substituted with any atom constituting the crystal structure of the Heusler alloy. Materials in which the first atoms enter between the crystal lattices are called interstitial solid solutions, and materials in which some atoms constituting the crystal lattice are substituted with first atoms are called substitutional solid solutions. At least a part of the first atoms are preferably substituted with any atom constituting the crystal structure of the Heusler alloy. Although the details will be described later, if the size of the added atoms is large enough to substitute the atoms constituting the Heusler alloy, the effect of promoting the crystallization of the first layer 1A is large.

A first surface S1 of the first layer 1A on the side of the nonmagnetic layer 3 may have a lower concentration of the first atoms than a second surface S2 on the side opposite to the first surface S1. When this configuration is satisfied, a sharp change in the first atom concentration can be prevented, and electron scattering at the interface between the first ferromagnetic layer 1 and the nonmagnetic layer 3 can be suppressed.

The second layer 1B contains a ferromagnetic material different from the first layer 1A. The Heusler alloys of the second layer 1B and the first layer 1A may contain different ferromagnetic materials. The second layer 1B is at least partially crystallized. For example, the second layer 1B may be entirely crystallized.

The crystal structure of the second layer 1B is, for example, a bcc structure or an fcc structure. When the second layer 1B has the bcc structure or the fcc structure, the first layer 1A has the bcc structure and is easily crystallized. As a result, the crystallinity of the first layer 1A is improved and the MR ratio of the magnetoresistance effect element 10 is increased.

The second layer 1B contains the first atoms described above. The second layer 1B may contain at least one atom selected from the group consisting of Mg, Al, Cr, Mn, Ni, Cu, Zn, Pd, Cd, In, Sn, Sb, Pt, Au, and Bi.

The ferromagnetic material contained in the second layer 1B is represented by, for example, $Co_xFe_{1-x}$-A. x is 0 or more and 1 or less, and A is the first atom. The first atom may enter the CoFe crystal structure or may be substituted with any element of the CoFe crystal. It is preferable that at least part of the first atoms are substituted with any atom that constitutes the crystal structure of the ferromagnetic material contained in the second layer 1B.

The concentration of the first atoms in the second layer 1B is, for example, higher than the concentration of the first atoms in the first layer 1A. That is, the concentration of the first atoms in the first layer 1A is, for example, lower than the concentration of the first atoms in the second layer 1B. When the concentration of the first atoms in the first layer 1A is low, the crystallinity of the first layer 1A increases.

The second layer 1B is close to, for example, the first layer 1A. Another layer may be sandwiched between the second layer 1B and the first layer 1A. When the first layer 1A and the second layer 1B are close to each other, it is preferable that the first layer 1A and the second layer 1B are lattice-matched. Lattice-matching between the first layer 1A and the second layer 1B means that atoms are arranged continuously in the lamination direction at the interface between the first layer 1A and the second layer 1B. The lattice-matching degree between the first layer 1A and the second layer 1B is, for example, within 5%. The lattice-matching degree is the degree of deviation of the lattice constant of the first layer 1A with respect to the lattice constant of the second layer 1B. When the lattice constant of the second layer 1B is used as a reference, the lattice constant of the first layer 1A is, for example, 95% or more and 105% or less of the lattice constant of the second layer 1B. When the first layer 1A and the second layer 1B are lattice-matched, the MR ratio of the magnetoresistance effect element 10 increases.

The second ferromagnetic layer 2 contains a ferromagnetic material. The second ferromagnetic layer 2 includes a third layer 2A and a fourth layer 2B. The third layer 2A is closer to the nonmagnetic layer 3 than the fourth layer 2B.

The third layer 2A contains a Heusler alloy containing Co. The third layer 2A may be made of a Heusler alloy containing Co. The third layer 2A may be made of the same material as the first layer 1A. The Heusler alloy of the third layer 2A may be at least partially crystallized or entirely crystallized.

The third layer 2A contains the first atoms. The first atoms are added in the third layer 2A. The third layer 2A may contain additional atoms other than the first atoms. The third layer 2A may contain one or more atoms selected from the group consisting of Mg, Al, Cr, Mn, Ni, Cu, Zn, Pd, Cd, In, Sn, Sb, Pt, Au, and Bi.

Even when the first atom enters between the crystal lattices of the Heusler alloy that constitutes the third layer 2A, the first atom may be substituted with any atom that constitutes the crystal structure of the Heusler alloy, a part of the first atom may enter between the crystal lattices of the Heusler alloy, and the remaining part may be substituted with any atom constituting the crystal structure of the Heusler alloy.

The first surface S3 of the third layer 2A on the side of the nonmagnetic layer 3 may have a lower first atom concentration than the second surface S4 on the side opposite to the first surface S3.

The fourth layer 2B contains a ferromagnetic material different from that of the third layer 2A. The fourth layer 2B contains a ferromagnetic material different from that of the third layer 2A. The fourth layer 2B is at least partially crystallized. For example, the fourth layer 2B may be entirely crystallized. The crystal structure of the fourth layer 2B is, for example, a bcc structure or an fcc structure.

The fourth layer 2B contains the first atoms described above. The fourth layer 2B may contain one or more atoms selected from the group consisting of Mg, Al, Cr, Mn, Ni, Cu, Zn, Pd, Cd, In, Sn, Sb, Pt, Au, and Bi.

For example, the ferromagnetic material contained in the fourth layer 2B is represented by $Co_xFe_{1-x}$-A. x is 0 or more and 1 or less, and A is the first atom. The first atom may enter the CoFe crystal structure or may be substituted with any element of the CoFe crystal. It is preferable that at least part of the first atoms are substituted with any atom that constitutes the crystal structure of the ferromagnetic material contained in the fourth layer 2B.

The concentration of the first atoms in the fourth layer 2B is, for example, higher than the concentration of the first atoms in the third layer 2A. That is, the concentration of the first atoms in the third layer 2A is, for example, lower than the concentration of the first atoms in the fourth layer 2B.

The fourth layer 2B is close to, for example, the third layer 2A. Another layer may be sandwiched between the fourth layer 2B and the third layer 2A. When the third layer 2A and the fourth layer 2B are close to each other, the third layer 2A and the fourth layer 2B are preferably lattice-matched.

The nonmagnetic layer 3 is sandwiched between the first ferromagnetic layer 1 and the second ferromagnetic layer 2. The nonmagnetic layer 3 has a thickness, for example, within a range of 1 nm or more and 10 nm or less. The nonmagnetic layer 3 inhibits magnetic coupling between the first ferromagnetic layer 1 and the second ferromagnetic layer 2.

The nonmagnetic layer 3 is made of, for example, a nonmagnetic metal. The nonmagnetic layer 3 is, for example, a metal or alloy containing any element selected from the group consisting of Cu, Au, Ag, Al, and Cr. Metals or alloys containing these elements are excellent in electrical conductivity and reduce the area resistance (hereinafter, referred to as RA) of the magnetoresistance effect element 10. The nonmagnetic layer 3 contains, for example, atoms selected from the group consisting of Cu, Au, Ag, Al, and Cr as main constituent atoms. The main constituent atoms means that the proportion of Cu, Au, Ag, Al, and Cr in the composition formula is 50% or more. The nonmagnetic layer 3 preferably contains Ag, and preferably contains Ag as a main constituent atom. Since Ag has a long spin diffusion length, the magnetoresistance effect element 10 using Ag exhibits a large MR ratio.

The nonmagnetic layer 3 may be an insulator or a semiconductor. Nonmagnetic insulators are, for example, $Al_2O_3$, $SiO_2$, MgO, $MgAl_2O_4$, and materials in which a part of Al, Si, and Mg are substituted with Zn, Be, and the like. These materials have a large bandgap and excellent insulating properties. When the nonmagnetic layer 3 is made of a nonmagnetic insulator, the nonmagnetic layer 3 is a tunnel barrier layer. Nonmagnetic semiconductors are, for example, Si, Ge, $CuInSe_2$, $CuGaSe_2$, $Cu(In, Ga)Se_2$, and the like.

The magnetoresistance effect element 10 may include layers other than the first ferromagnetic layer 1, the second ferromagnetic layer 2, and the nonmagnetic layer 3 described above. For example, an underlayer may be provided on the surface of the first ferromagnetic layer 1 on the side opposite to the nonmagnetic layer 3 and a cap layer may be provided on the surface of the second ferromagnetic layer 2 on the side opposite to the nonmagnetic layer 3. The underlayer and the cap layer improve the crystal orientation of the first ferromagnetic layer 1 and the second ferromagnetic layer 2. The underlayer and the cap layer contains, for example, Ru, Ir, Ta, Ti, Al, Au, Ag, Pt, and Cu.

Figure 3:
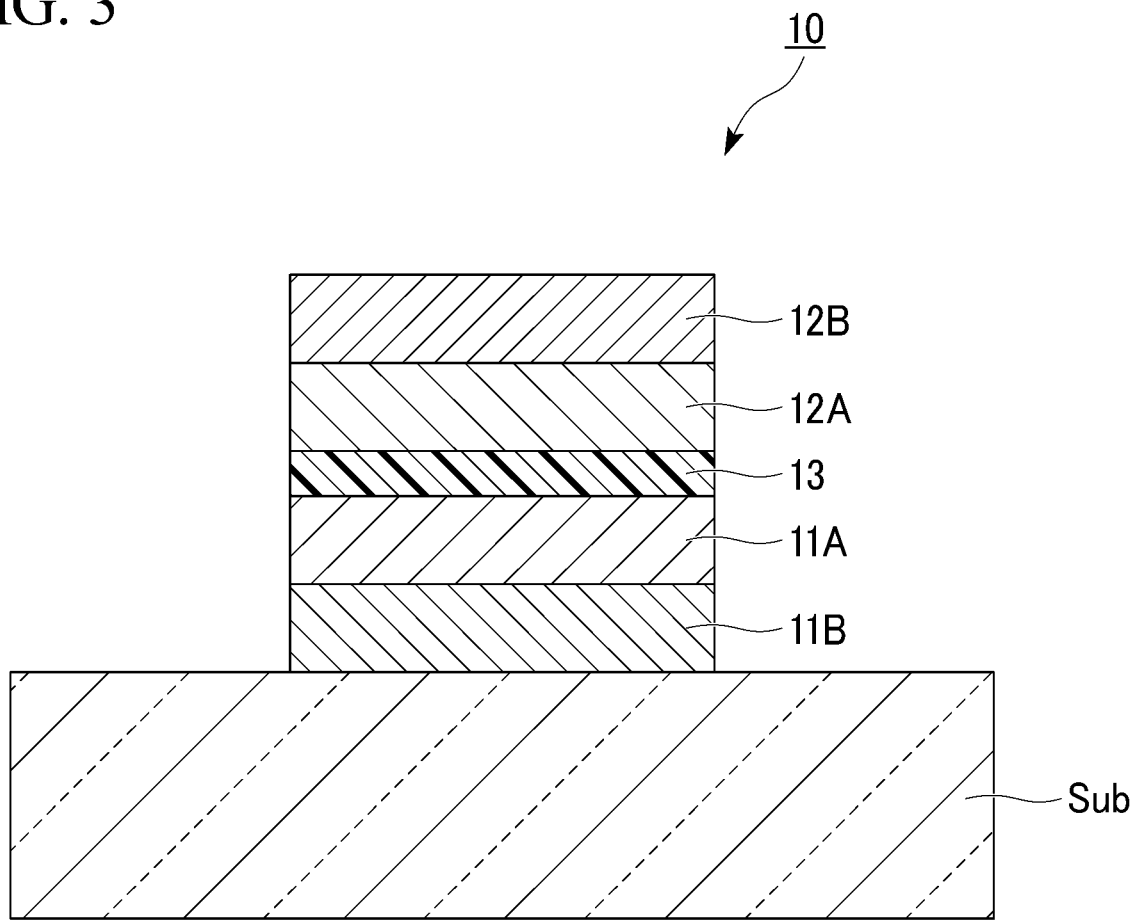
FIG. 3 is a cross-sectional view illustrating a method of manufacturing the magnetoresistance effect element according to the first embodiment.

Next, a method of manufacturing the magnetoresistance effect element 10 will be described. FIG. 3 is a cross-sectional view illustrating a method of manufacturing the magnetoresistance effect element 10 according to the first embodiment.

First, a substrate Sub that serves as a base for film formation is prepared. The substrate may be crystalline or amorphous. Examples of crystalline substrates include metal oxide single crystals, silicon single crystals, and sapphire single crystals. Examples of amorphous substrates include, for example, silicon single crystal with a thermal oxide film, glass, ceramics, and quartz. In the magnetoresistance effect element 10 according to this embodiment, the substrate Sub can be arbitrarily selected because the first layer 1A and the third layer 2A are crystallized even if the substrate Sub is an amorphous substrate.

Next, a second layer 11B, a first layer 11A, a nonmagnetic layer 13, a third layer 12A, and a fourth layer 12B are laminated in this order on the substrate Sub. These layers are deposited, for example, by a sputtering method. The second layer 11B corresponds to the second layer 1B and is the same material as the second layer 1B. The second layer 11B is, for example, $Co_xFe_{1-x}$-A. The first layer 11A corresponds to the first layer 1A and is, for example, a Heusler alloy containing Co. The first layer 11A may not contain the first atoms immediately after film formation. The nonmagnetic layer 13 corresponds to the nonmagnetic layer 3 and is the same material as the nonmagnetic layer 3. The third layer 12A corresponds to the third layer 2A and is, for example, a Heusler alloy containing Co. The third layer 12A may not contain the first atoms immediately after film formation. The fourth layer 12B corresponds to the fourth layer 2B and is the same material as the fourth layer 2B. The fourth layer 12B is, for example, $Co_xFe_{1-x}$-A.

The second layer 11B is amorphous after film formation. Since the first layer 11A grows on the amorphous underlayer, the first layer grows in the (011) direction in which the first layer is easy to grow. Therefore, the first layer 11A becomes crystalline with low crystallinity or amorphous after film formation. Similarly, the third layer 12A also becomes crystalline with low crystallinity or amorphous after film formation. The fourth layer 12B is amorphous after film formation.

Next, a laminate laminated on the substrate Sub is annealed. The annealing temperature is, for example, 300° C. or lower, and is, for example, 250° C. or higher and 300° C. or lower.

The first atoms contained in the second layer 11B are diffused into the first layer 11A by annealing. Similarly, the first atoms contained in the fourth layer 12B are diffused into the third layer 12A by annealing. When the first atoms are diffused in the first layer 11A or the third layer 12A, the atoms in these layers are mixed. The mixed atoms are rearranged to crystallize the first layer 11A and the third layer 12A.

Further, the crystallization of the first layer 11A progresses simultaneously with the regular arrangement of the second layer 11B, and the crystallization of the third layer 12A progresses simultaneously with the regular arrangement of the fourth layer 12B. The regular arrangement means that the amorphous crystallizes or the atoms that have already crystallized rearrange. When the first layer 11A and the second layer 11B are close to each other, the first layer 11A is rearranged under the influence of the second layer 11B.

Similarly, when the third layer 12A and the fourth layer 12B are close to each other, the third layer 12A is rearranged under the influence of the fourth layer 12B. That is, since the crystallization of the first layer 11A progresses while being dragged by the regular arrangement of the second layer 11B, the crystallinity is high. Similarly, since the crystallization of the third layer 12A progresses while being dragged by the regular arrangement of the fourth layer 12B, the crystallinity is high.

As described above, since the laminate is annealed, the first layer 11A is crystallized to become the first layer 1A, the second layer 11B is crystallized to become the second layer 1B, the third layer 12A is crystallized to become the third layer 2A, and the fourth layer 12B is crystallized to become the fourth layer 2B. Further, the nonmagnetic layer 13 becomes the nonmagnetic layer 3. As a result, the magnetoresistance effect element 10 shown in FIG. 1 can be obtained.

As described above, the Heusler alloy can be crystallized regardless of the underlying crystal structure by using the method of manufacturing the magnetoresistance effect element 10 according to this embodiment. Here, although one of the steps of the method of manufacturing the magnetoresistance effect element 10 has been introduced, the above method can also be applied to the method of crystallization of a single ferromagnetic layer. For example, a Heusler alloy having crystallinity can be obtained by laminating a ferromagnetic layer containing a first atom and a ferromagnetic layer containing a Heusler alloy and heating them.

In the method of manufacturing the magnetoresistance effect element 10 according to this embodiment, the first ferromagnetic layer 1 and the second ferromagnetic layer 2 crystallize at a low temperature of 300° C. or lower. If the temperature is 300° C. or lower, for example, even if annealing is performed after manufacturing other components of the magnetic head, adverse effects on other components (for example, the magnetic shield) can be reduced. Therefore, the timing of annealing is not limited, and the manufacture of elements such as magnetic heads is facilitated.

Further, in the magnetoresistance effect element 10 according to this embodiment, the first layer 1A and the second layer 1B sandwiching the nonmagnetic layer 3 are crystallized. Since the first layer 1A and the second layer 1B contain the crystallized Heusler alloy, high spin polarization is exhibited. That is, the magnetoresistance effect element 10 according to this embodiment exhibits a high MR ratio.

Second Embodiment

Figure 4:
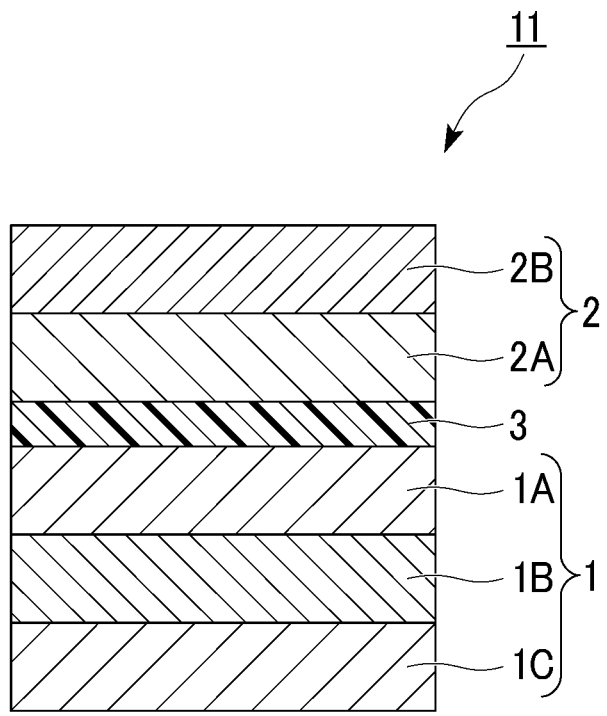
FIG. 4 is a cross-sectional view of a magnetoresistance effect element according to a second embodiment.

FIG. 4 is a cross-sectional view of a magnetoresistance effect element 11 according to a second embodiment. The magnetoresistance effect element 11 includes the first ferromagnetic layer 1, the second ferromagnetic layer 2, and the nonmagnetic layer 3. The magnetoresistance effect element 11 is different from the magnetoresistance effect element 10 according to the first embodiment in that the first ferromagnetic layer 1 includes a fifth layer 1C. In the magnetoresistance effect element 11 according to the second embodiment, the same components as those of the magnetoresistance effect element 10 according to the first embodiment are denoted by the same reference numerals, and descriptions thereof are omitted.

The first ferromagnetic layer 1 includes the first layer 1A, the second layer 1B, and the fifth layer 1C. The first layer 1A and the fifth layer 1C sandwich the second layer 1B. The fifth layer 1C contains the same Heusler alloy as that of the first layer 1A. The first ferromagnetic layer 1 can also be considered to contain a ferromagnetic material inside the Heusler alloy that is different from the Heusler alloy corresponding to the second layer 1B. The fifth layer 1C contains a first atom.

The magnetoresistance effect element 11 according to the second embodiment has the same effect as the magnetoresistance effect element 10 according to the first embodiment. Further, when the second layer 1B containing the first atoms that promote crystallization exists inside the Heusler alloy, the first atoms diffuse from the second layer 1B to the first layer 1A and the fifth layer 1C during annealing. If a diffusion source for diffusing the first atoms exists in the center of the thickness direction of the first ferromagnetic layer 1, the crystallization of the first ferromagnetic layer 1 is further promoted. Therefore, the magnetoresistance effect element 10 according to the second embodiment exhibits a high MR ratio.

Third Embodiment

Figure 5:
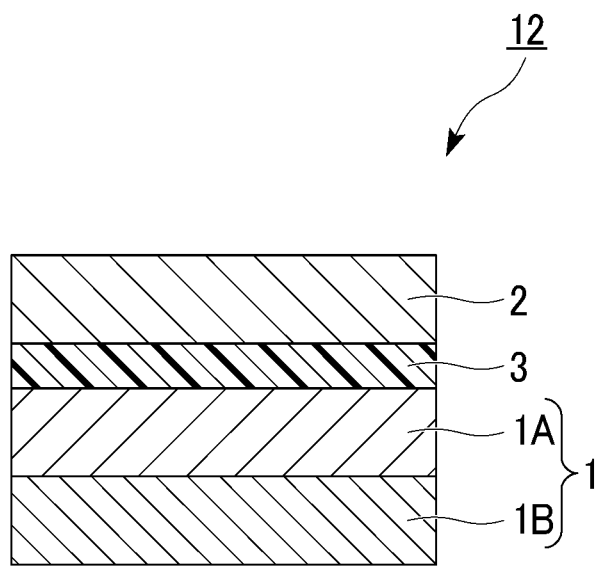
FIG. 5 is a cross-sectional view of a magnetoresistance effect element according to a third embodiment.

FIG. 5 is a cross-sectional view of a magnetoresistance effect element 12 according to a third embodiment. The magnetoresistance effect element 12 includes the first ferromagnetic layer 1, the second ferromagnetic layer 2, and the nonmagnetic layer 3. The magnetoresistance effect element 12 according to the third embodiment is different from the magnetoresistance effect element 10 in that the second ferromagnetic layer 2 is composed of a single layer. In the magnetoresistance effect element 12 according to the third embodiment, the same components as those of the magnetoresistance effect element 10 according to the first embodiment are denoted by the same reference numerals, and descriptions thereof are omitted.

The second ferromagnetic layer 2 according to the third embodiment may be a Heusler alloy or a ferromagnetic layer other than the Heusler alloy. When the second ferromagnetic layer 2 contains a Heusler alloy, the same material as the first ferromagnetic layer 1 can be used. When the second ferromagnetic layer 2 is a ferromagnetic layer other than a Heusler alloy, the second ferromagnetic layer 2 contains, for example, metals selected from the group consisting of Cr, Mn, Co, Fe, and Ni, an alloy containing one or more of these metals, an alloy containing these metals and at least one element selected from B, C, and N. The second ferromagnetic layer 2 is, for example, Co—Fe or Co—Fe—B.

The second ferromagnetic layer 2 according to the third embodiment may be a magnetization free layer or a magnetization fixed layer. The second ferromagnetic layer 2 may be closer to the substrate Sub than the first ferromagnetic layer 1 or farther from the substrate Sub than the first ferromagnetic layer 1.

The magnetoresistance effect element 12 according to the third embodiment has the same effect as the magnetoresistance effect element 10 according to the first embodiment.

Fourth Embodiment

Figure 6:
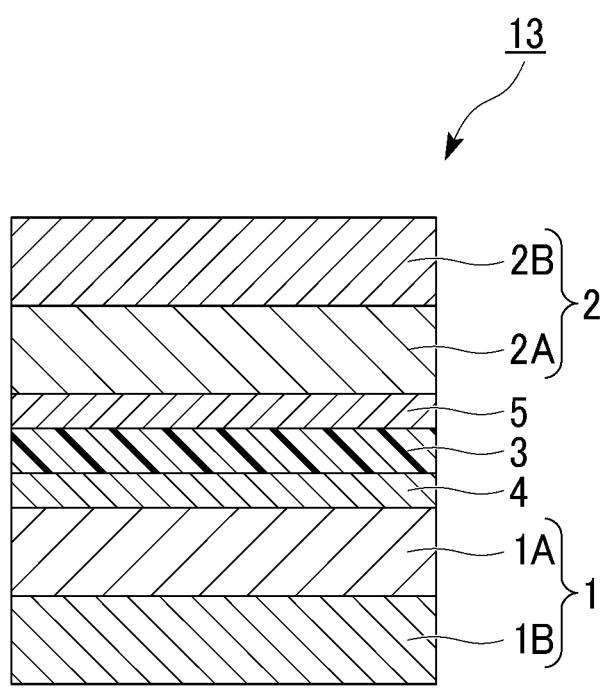
FIG. 6 is a cross-sectional view of a magnetoresistance effect element according to a fourth embodiment.

FIG. 6 is a cross-sectional view of a magnetoresistance effect element 13 according to a fourth embodiment. The magnetoresistance effect element 13 includes the first ferromagnetic layer 1, the second ferromagnetic layer 2, the nonmagnetic layer 3, an NiAl layer 4, and an NiAl layer 5. The magnetoresistance effect element 13 is different from the magnetoresistance effect element 10 according to the first embodiment in that the NiAl layer 4 and the NiAl layer 5 are provided. In the magnetoresistance effect element 13 according to the fourth embodiment, the same components as those of the magnetoresistance effect element 10 according to the first embodiment are denoted by the same reference numerals, and descriptions thereof are omitted.

The NiAl layer 4 and the NiAl layer 5 are layers each containing a NiAl alloy. The NiAl layer 4 is a buffer layer that relaxes the lattice mismatch between the first ferromagnetic layer 1 and the nonmagnetic layer 3. The NiAl layer 5 is a buffer layer that relaxes the lattice mismatch between the nonmagnetic layer 3 and the second ferromagnetic layer 2.

For example, each of the NiAl layer 4 and the NiAl layer 5 has a thickness t of 0<t≤0.63 nm. When the thickness t is too large, electrons moving from the first ferromagnetic layer 1 (or the second ferromagnetic layer 2) to the second ferromagnetic layer 2 (or the first ferromagnetic layer 1) may undergo spin scattering. When the thickness t is within this range, spin scattering in moving electrons is suppressed, lattice mismatch between the first ferromagnetic layer 1 and the nonmagnetic layer 3 is reduced, and lattice mismatch between the nonmagnetic layer 3 and the second ferromagnetic layer 2 is reduced. When the lattice mismatch of each layer becomes smaller, the MR ratio of the magnetoresistance effect element 13 is improved.

Although an example in which the magnetoresistance effect element 13 includes both the NiAl layer 4 and the NiAl layer 5 is shown here, only one of them may be provided.

The magnetoresistance effect element 13 according to the fourth embodiment has the same effect as the magnetoresistance effect element 10 according to the first embodiment.

Although several embodiments have been described in detail with reference to the drawings, each configuration, combination thereof, and the like in each embodiment are examples, and addition, omission, substitution, and other modifications of the configuration can be made without departing from the spirit of the present disclosure.

The magnetoresistance effect elements 10, 11, 12, and 13 described above can be used for various applications. The magnetoresistance effect elements 10, 11, 12, and 13 can be applied to, for example, magnetic heads, magnetic sensors, magnetic memories, high-frequency filters, and the like.

Next, application examples of the magnetoresistance effect element according to this embodiment will be described. Additionally, in the following application examples, the magnetoresistance effect element 10 is used, but the magnetoresistance effect element is not limited thereto.

Figure 7:
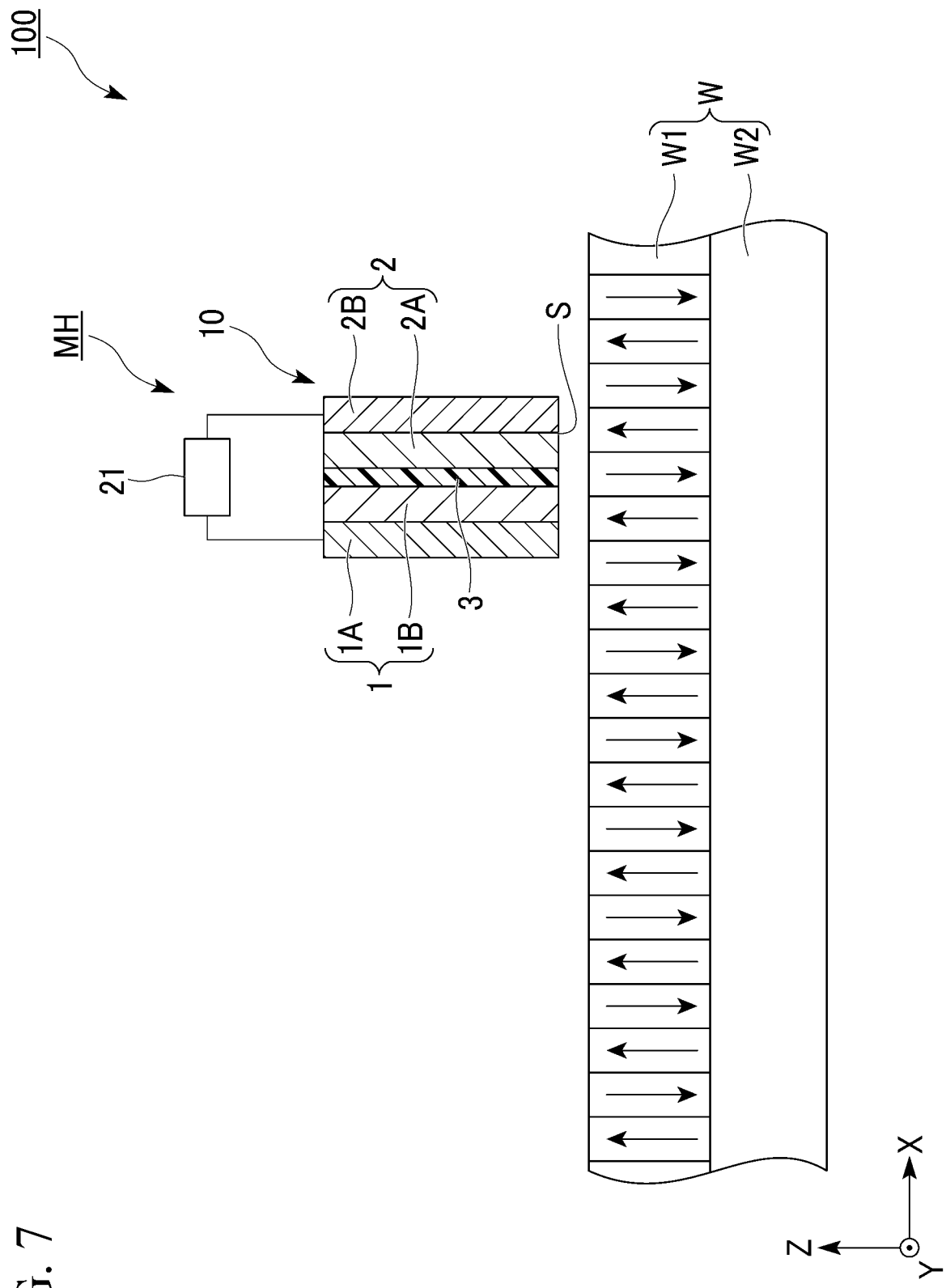
FIG. 7 is a cross-sectional view of a magnetic recording element according to Application Example 1.

FIG. 7 is a cross-sectional view of a magnetic recording element 100 according to Application Example 1. FIG. 7 is a cross-sectional view in which the magnetoresistance effect element 10 is cut along the lamination direction.

As shown in FIG. 7, the magnetic recording element 100 includes a magnetic head MH and a magnetic recording medium W. In FIG. 7, one direction in which the magnetic recording medium W extends is the X direction, and the direction perpendicular to the X direction is the Y direction. The XY plane is parallel to the main surface of the magnetic recording medium W. The direction connecting the magnetic recording medium W and the magnetic head MH and perpendicular to the XY plane is the Z direction.

The magnetic head MH has an air bearing surface (medium facing surface) S facing the surface of the magnetic recording medium W. The magnetic head MH moves along the surface of the magnetic recording medium W at a certain distance from the magnetic recording medium W in the +X direction or the −X direction. The magnetic head MH includes the magnetoresistance effect element 10 acting as a magnetic sensor and a magnetic recording section (not shown). The resistance tester 21 measures the resistance value of the magnetoresistance effect element 10 in the lamination direction.

The magnetic recording section applies a magnetic field to a recording layer W1 of the magnetic recording medium W to determine the magnetization direction of the recording layer Wi. That is, the magnetic recording section performs magnetic recording on the magnetic recording medium W. The magnetoresistance effect element 10 reads magnetization information of the recording layer W1 written by the magnetic recording section.

The magnetic recording medium W includes the recording layer W1 and a backing layer W2. The recording layer Wi is a portion for magnetic recording and the backing layer W2 is a magnetic path (magnetic flux path) for returning magnetic flux for writing back to the magnetic head MH. The recording layer W1 records magnetic information in the magnetization direction.

The second ferromagnetic layer 2 of the magnetoresistance effect element 10 is, for example, a magnetization free layer. Therefore, the second ferromagnetic layer 2 exposed on the air bearing surface S is affected by the magnetization recorded in the recording layer W1 of the facing magnetic recording medium W. For example, in FIG. 7, the magnetization direction of the second ferromagnetic layer 2 is oriented in the +Z direction under the influence of the magnetization directed in the +Z direction of the recording layer W1. In this case, the magnetization directions of the first ferromagnetic layer 1 and the second ferromagnetic layer 2 which are magnetization fixed layers are parallel to each other.

Here, the resistance when the magnetization directions of the first ferromagnetic layer 1 and the second ferromagnetic layer 2 are parallel is different from the resistance when the magnetization directions of the first ferromagnetic layer 1 and the second ferromagnetic layer 2 are antiparallel. The MR ratio of the magnetoresistance effect element 10 increases as the difference between the parallel resistance and the antiparallel resistance increases. The magnetoresistance effect element 10 according to this embodiment contains a crystallized Heusler alloy and has a large MR ratio. Therefore, the magnetization information of the recording layer W1 can be accurately read out as a resistance value change by the resistance tester 21.

The shape of the magnetoresistance effect element 10 of the magnetic head MH is not particularly limited. For example, the first ferromagnetic layer 1 may be installed at a position away from the magnetic recording medium W in order to avoid the influence of the leakage magnetic field of the magnetic recording medium W on the first ferromagnetic layer 1 of the magnetoresistance effect element 10.

Figure 8:
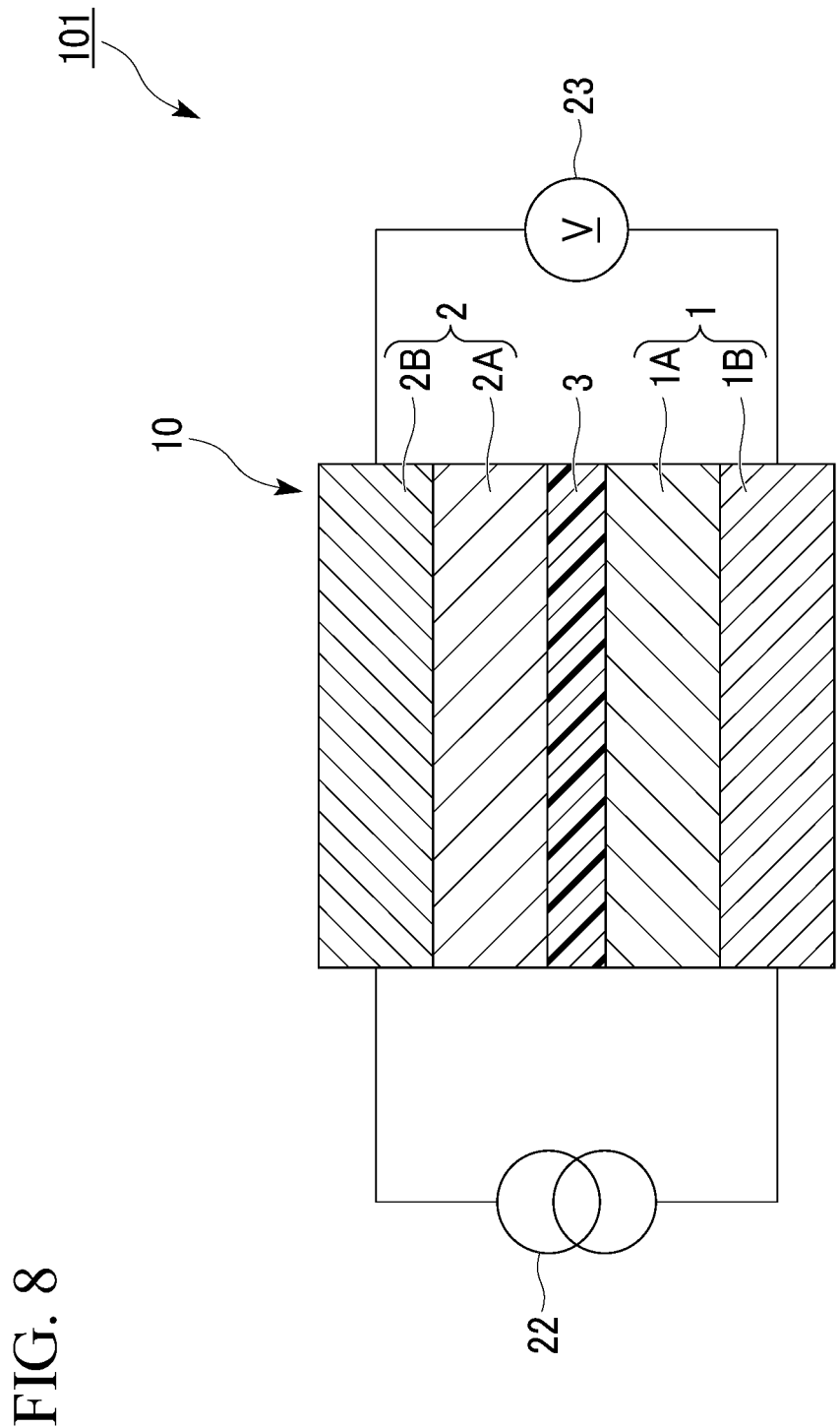
FIG. 8 is a cross-sectional view of a magnetic recording element according to Application Example 2.

FIG. 8 is a cross-sectional view of a magnetic recording element 101 according to Application Example 2. FIG. 8 is a cross-sectional view in which the magnetic recording element 101 is cut along the lamination direction.

As shown in FIG. 8, the magnetic recording element 101 includes the magnetoresistance effect element 10, a power source 22, and a measurement section 23. The power source 22 applies a potential difference in the lamination direction of the magnetoresistance effect element 10. The power source 22 is, for example, a DC power source. The measurement section 23 measures the resistance value of the magnetoresistance effect element 10 in the lamination direction.

When a potential difference is generated between the first ferromagnetic layer 1 and the second ferromagnetic layer 2 by the power source 22, a current flows in the lamination direction of the magnetoresistance effect element 10. The current is spin-polarized when passing through the first ferromagnetic layer 1 and becomes a spin-polarized current. The spin-polarized current reaches the second ferromagnetic layer 2 through the nonmagnetic layer 3. The magnetization of the second ferromagnetic layer 2 undergoes magnetization reversal upon receiving a spin transfer torque (STT) due to the spin-polarized current. As the relative angle between the magnetization direction of the first ferromagnetic layer 1 and the magnetization direction of the second ferromagnetic layer 2 changes, the resistance value of the magnetoresistance effect element 10 in the lamination direction changes. The resistance value in the lamination direction of the magnetoresistance effect element 10 is read by the measurement section 23. That is, the magnetic recording element 101 shown in FIG. 8 is a spin transfer torque (STT) type magnetic recording element.

Since the magnetic recording element 101 shown in FIG. 8 includes the magnetoresistance effect element 10 containing a crystallized Heusler alloy and having a large MR ratio, data can be accurately recorded.

Figure 9:
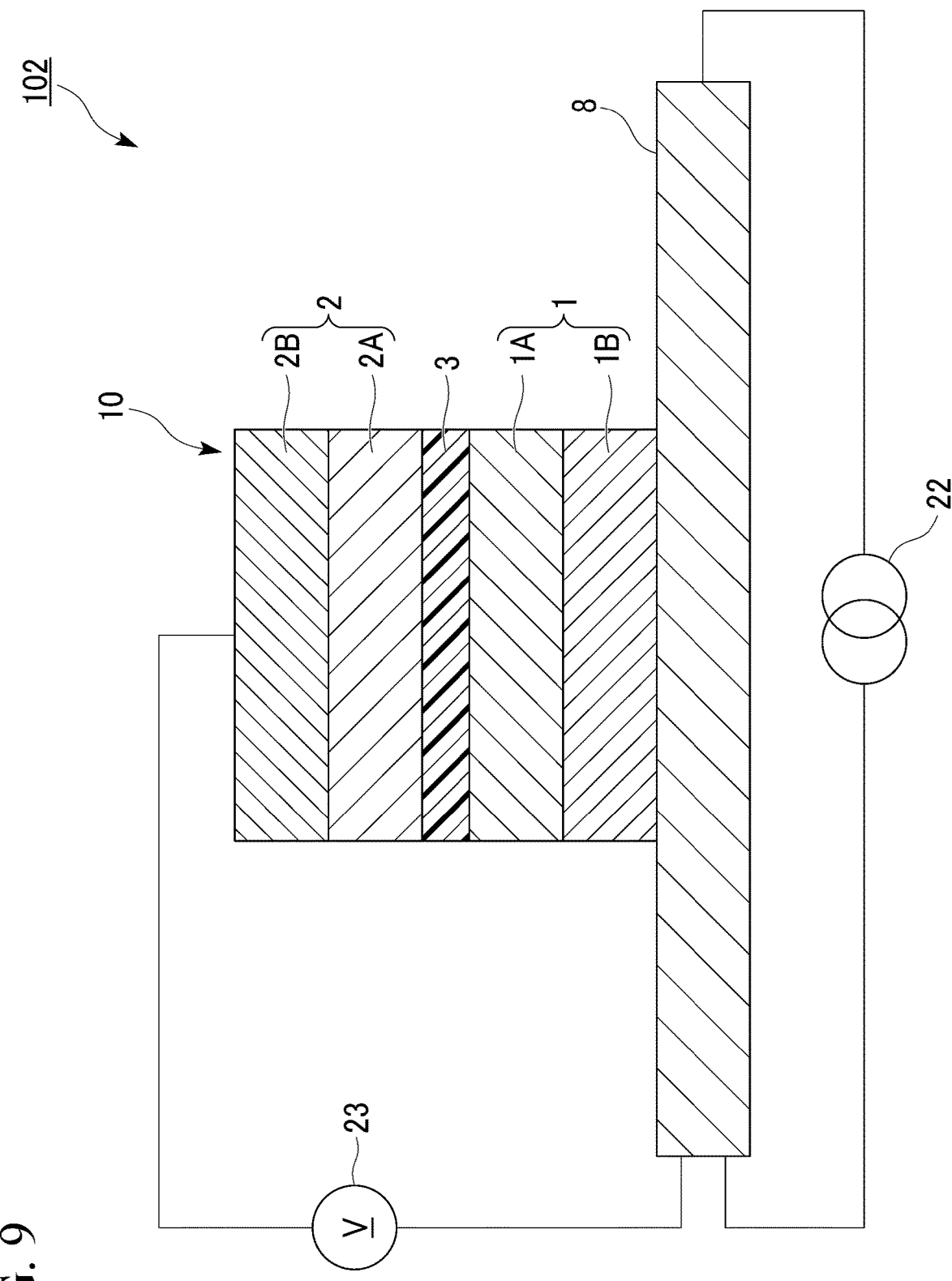
FIG. 9 is a cross-sectional view of a magnetic recording element according to Application Example 3.

FIG. 9 is a cross-sectional view of a magnetic recording element 102 according to Application Example 3. FIG. 9 is a cross-sectional view in which the magnetic recording element 102 is cut along the lamination direction.

As shown in FIG. 9, the magnetic recording element 102 includes the magnetoresistance effect element 10, a spin-orbit torque wiring 8, the power source 22, and the measurement section 23.

The spin-orbit torque wiring 8 is in contact with, for example, the first ferromagnetic layer 1. The spin-orbit torque wiring 8 extends in one in-plane direction. In Application Example 3, the first ferromagnetic layer 1 is a magnetization free layer and the second ferromagnetic layer 2 is a magnetization fixed layer.

The power source 22 is connected to the first end and the second end of the spin-orbit torque wiring 8. The first end and the second end sandwich the magnetoresistance effect element 10 in plan view. The power source 22 applies a write current along the spin-orbit torque wiring 8. The measurement section 23 measures the resistance value of the magnetoresistance effect element 10 in the lamination direction.

When a potential difference is generated between the first end and the second end of the spin-orbit torque wiring 8 by the power source 22, a current flows in the in-plane direction of the spin-orbit torque wiring 8. The spin-orbit torque wiring 8 has a function of generating a spin current by the spin Hall effect when a current flows. The spin-orbit torque wiring 8 contains, for example, any one of metals, alloys, intermetallic compounds, metal borides, metal carbides, metal silicides, and metal phosphides that have the function of generating a spin current by the spin Hall effect when a current flows. For example, the wiring includes a nonmagnetic metal having an atomic number of 39 or higher with d electrons or f electrons in the outermost shell.

When a current flows in the in-plane direction of the spin-orbit torque wiring 8, a spin-orbit interaction causes a spin Hall effect. The spin Hall effect is a phenomenon in which moving spins are bent in a direction perpendicular to the current flow direction. The spin Hall effect produces uneven distribution of spins in the spin-orbit torque wiring 8 and induces a spin current in the thickness direction of the spin-orbit torque wiring 8. Spins are injected from the spin-orbit torque wiring 8 into the first ferromagnetic layer 1 by the spin current.

Spins injected into the first ferromagnetic layer 1 apply spin-orbit torque (SOT) to the magnetization of the first ferromagnetic layer 1. The first ferromagnetic layer 1 receives spin-orbit torque (SOT) and undergoes magnetization reversal. As the relative angle between the magnetization direction of the first ferromagnetic layer 1 and the magnetization direction of the second ferromagnetic layer 2 changes, the resistance value of the magnetoresistance effect element 10 in the lamination direction changes. The resistance value in the lamination direction of the magnetoresistance effect element 10 is read by the measurement section 23. That is, the magnetic recording element 102 shown in FIG. 9 is a spin orbit torque (SOT) type magnetic recording element.

Since the magnetic recording element 102 shown in FIG. 9 includes the magnetoresistance effect element 10 containing a crystallized Heusler alloy and having a large MR ratio, data can be accurately recorded.

Figure 10:
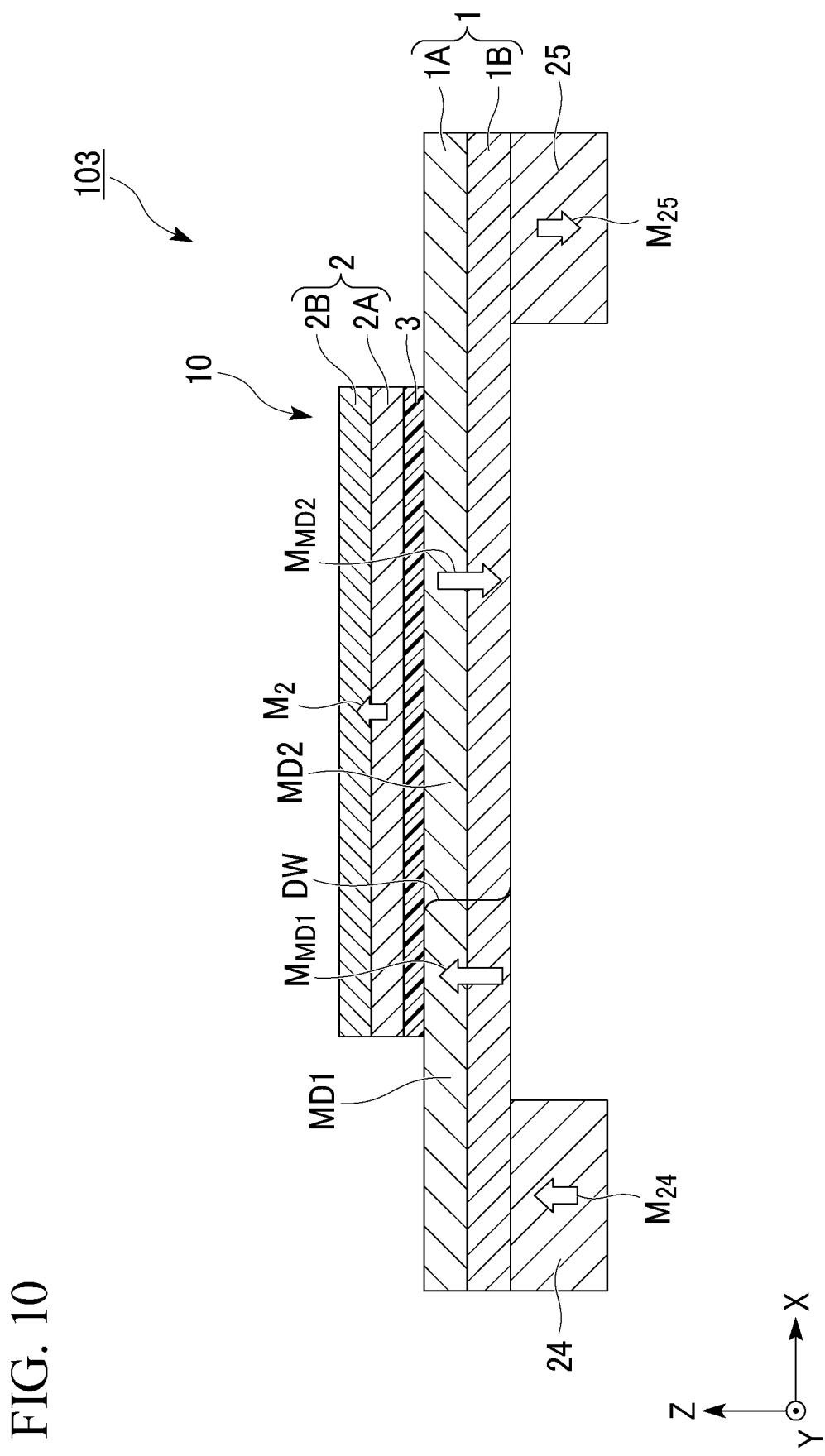
FIG. 10 is a cross-sectional view of a domain wall motion element according to Application Example 4.

FIG. 10 is a cross-sectional view of a domain wall motion element (domain wall motion type magnetic recording element) according to Application Example 4. A domain wall motion element 103 includes the magnetoresistance effect element 10, a first magnetization fixed layer 24, and a second magnetization fixed layer 25. The magnetoresistance effect element 10 includes the first ferromagnetic layer 1, the second ferromagnetic layer 2, and the nonmagnetic layer 3. In FIG. 10, the direction in which the first ferromagnetic layer 1 extends is the X direction, the direction perpendicular to the X direction is the Y direction, and the direction perpendicular to the XY plane is the Z direction.

The first magnetization fixed layer 24 and the second magnetization fixed layer 25 are connected to the first end and the second end of the first ferromagnetic layer 1. The first end and the second end sandwich the second ferromagnetic layer 2 and the nonmagnetic layer 3 in the X direction when viewed from the Z direction.

The first ferromagnetic layer 1 is a layer in which information can be magnetically recorded by changing the internal magnetic state. The first ferromagnetic layer 1 has a first magnetic domain MD1 and a second magnetic domain MD2 therein. The magnetization at the position of the first ferromagnetic layer 1 that overlaps the first magnetization fixed layer 24 or the second magnetization fixed layer 25 in the Z direction is fixed in one direction. The magnetization at the position overlapping the first magnetization fixed layer 24 in the Z direction is fixed, for example, in the +Z direction, and the magnetization at the position overlapping the second magnetization fixed layer 25 in the Z direction is fixed, for example, in the −Z direction. As a result, a domain wall DW is formed at the boundary between the first magnetic domain MD1 and the second magnetic domain MD2. The first ferromagnetic layer 1 can have the domain wall DW therein. In the first ferromagnetic layer 1 shown in FIG. 10, the magnetization $M_{MD1}$ of the first magnetic domain MD1 is oriented in the +Z direction and the magnetization $M_{MD2}$ of the second magnetic domain MD2 is oriented in the −Z direction.

The domain wall motion element 103 can record data in multiple values or continuously depending on the position of the domain wall DW of the first ferromagnetic layer 1. Data recorded in the first ferromagnetic layer 1 is read out as a change in the resistance value of the domain wall motion element 103 when a read current is applied.

The ratio between the first magnetic domain MD1 and the second magnetic domain MD2 in the first ferromagnetic layer 1 changes as the domain wall DW moves. The magnetization $M_2$ of the second ferromagnetic layer 2 is, for example, the same direction (parallel) as the magnetization $M_{MD1}$ of the first magnetic domain MD1 and the opposite direction (antiparallel) to the magnetization $M_{MD2}$ of the second magnetic domain MD2. When the domain wall DW moves in the +X direction and the area of the first magnetic domain MD1 in the portion overlapping the second ferromagnetic layer 2 in plan view from the Z direction increases, the resistance value of the domain wall motion element 103 decreases. In contrast, when the domain wall DW moves in the −X direction and the area of the second magnetic domain MD2 in the portion overlapping the second ferromagnetic layer 2 in plan view from the Z direction increases, the resistance value of the domain wall motion element 103 increases.

The domain wall DW moves by applying a write current in the X direction of the first ferromagnetic layer 1 or by applying an external magnetic field. For example, when a write current (for example, a current pulse) is applied in the +X direction of the first ferromagnetic layer 1, electrons flow in the −X direction opposite to the current, so the domain wall DW moves in the −X direction. When a current flows from the first magnetic domain MD1 toward the second magnetic domain MD2, electrons spin-polarized in the second magnetic domain MD2 reverse the magnetization $M_{MD1}$ of the first magnetic domain MD1. The magnetization reversal of the magnetization $M_{MD1}$ of the first magnetic domain MD1 moves the domain wall DW in the −X direction.

Since the domain wall motion element 103 shown in FIG. 10 includes the magnetoresistance effect element 10 containing a crystallized Heusler alloy and having a large MR ratio, data can be accurately recorded.

Figure 11:
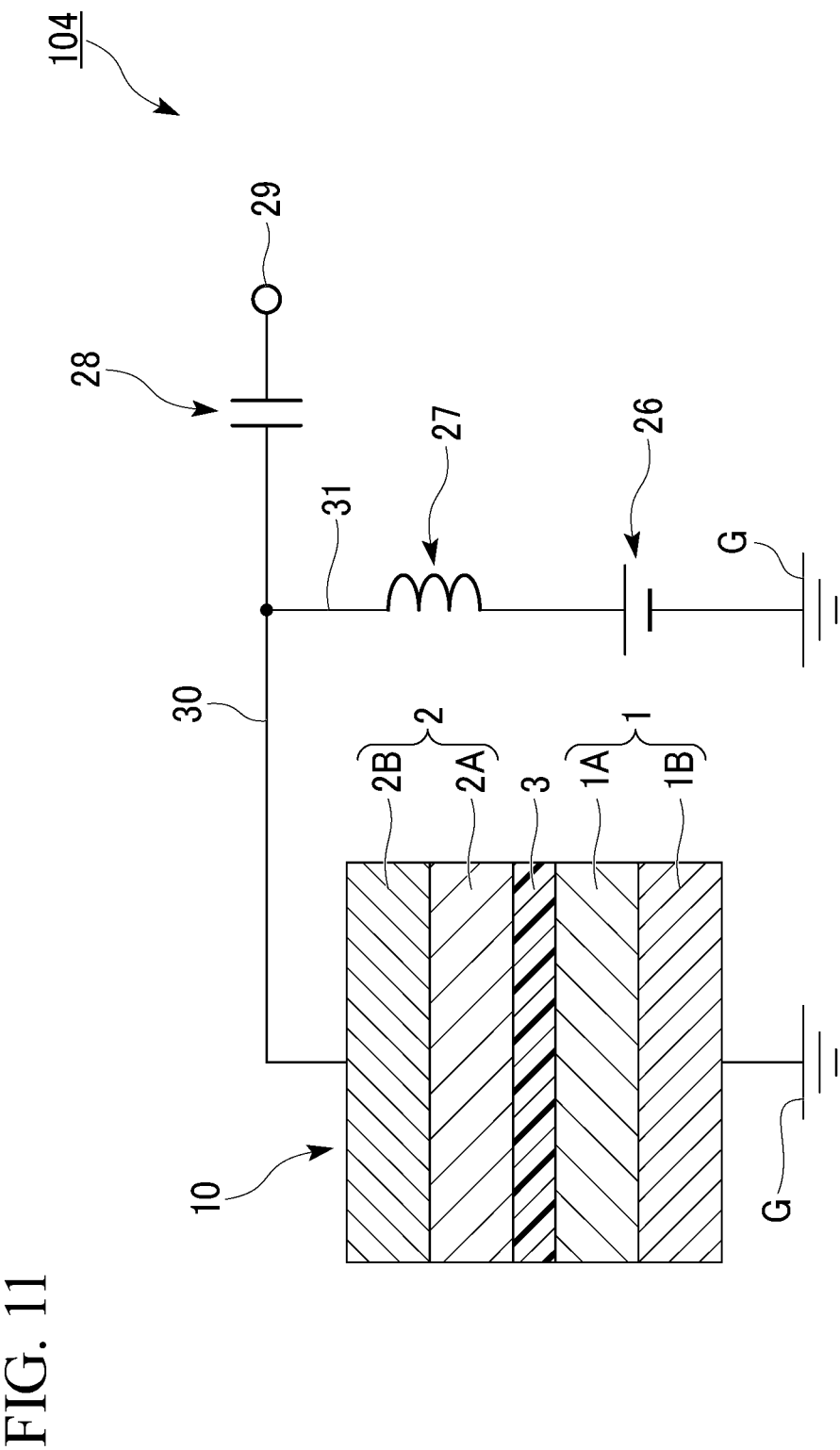
FIG. 11 is a cross-sectional view of a high-frequency device according to Application Example 5.

FIG. 11 is a schematic view of a high-frequency device 104 according to Application Example 5. As shown in FIG. 11, the high-frequency device 104 includes the magnetoresistance effect element 10, a DC power source 26, an inductor 27, a capacitor 28, an output port 29, and wirings 30 and 31.

The wiring 30 connects the magnetoresistance effect element 10 and the output port 29. The wiring 31 branches off from the wiring 30 and reaches the ground G via the inductor 27 and the DC power source 26. Known ones can be used for the DC power source 26, the inductor 27, and the capacitor 28. The inductor 27 cuts the high-frequency components of the current and passes the invariant component of the current. The capacitor 28 passes the high-frequency components of the current and cuts the invariant component of the current. The inductor 27 is arranged in a portion which is desired to be suppressed in the flow of high frequency current, and the capacitor 28 is arranged in a portion which is desired to be suppressed in the flow of direct current.

When an alternating current or alternating magnetic field is applied to the ferromagnetic layer included in the magnetoresistance effect element 10, the magnetization of the second ferromagnetic layer 2 processes. The magnetization of the second ferromagnetic layer 2 is strongly vibrated when the frequency of the high-frequency current or high-frequency magnetic field applied to the second ferromagnetic layer 2 is in the vicinity of the ferromagnetic resonance frequency of the second ferromagnetic layer 2 and is not vibrated appreciably at frequencies away from the ferromagnetic resonance frequency of the second ferromagnetic layer 2. This phenomenon is called a ferromagnetic resonance phenomenon.

The resistance value of the magnetoresistance effect element 10 changes due to the vibration of the magnetization of the second ferromagnetic layer 2. The DC power source 26 applies a DC current to the magnetoresistance effect element 10. The DC current flows in the lamination direction of the magnetoresistance effect element 10. The DC current flows to the ground G through the wirings 30 and 31 and the magnetoresistance effect element 10. The potential of the magnetoresistance effect element 10 changes according to Ohm's law. A high-frequency signal is output from the output port 29 according to a change in potential (a change in resistance value) of the magnetoresistance effect element 10.

Since the high-frequency device 104 shown in FIG. 11 includes the magnetoresistance effect element 10 containing a crystallized Heusler alloy and having a large variation in resistance value, a high-output and high-frequency signal can be transmitted.

EXAMPLE

Example 1

The magnetoresistance effect element 10 shown in FIG. 1 was manufactured as Example 1. First, Cr and Ag were deposited in order as underlayers on a silicon substrate. Then, $(Co_{0.5}Fe_{0.5})_{0.9}Mg_{0.1}$ was deposited as the second layer 1B on the underlayer. Mg corresponds to the first atom. Next, a Heusler alloy containing Co with a composition ratio of $Co_2FeGa_{0.5}Ge_{0.5}$ was deposited as the first layer 1A. Next, Ag was deposited as the nonmagnetic layer 3. Next, a Heusler alloy containing Co with a composition ratio of $Co_2FeGa_{0.5}Ge_{0.5}$ was deposited as the third layer 2A. Next, $(Co_{0.5}Fe_{0.5})_{0.9}Mg_{0.1}$ was deposited as the fourth layer 2B on the third layer 2A. Immediately after film formation, the first layer 1A and the third layer 2A were amorphous.

Next, a laminated laminate was annealed. Annealing was performed at 300° C. for 10 hours. The annealing crystallized the first layer 1A and the third layer 2A. Further, the crystallinity of the second layer 1B and the fourth layer 2B was improved with the crystallization of the first layer 1A and the third layer 2A. Further, it was confirmed that Mg was contained in the first layer 1A and the third layer 2A as the first atom by performing composition analysis of the first layer 1A and the third layer 2A after annealing.

The MR ratio and RA (surface resistance) of the manufactured magnetoresistance effect element 10 were measured. As the MR ratio, a change in the resistance value of the magnetoresistance effect element 10 was measured by monitoring the voltage applied to the magnetoresistance effect element 10 with a voltmeter while sweeping a magnetic field from the outside to the magnetoresistance effect element 10 with a constant current flowing in the lamination direction of the magnetoresistance effect element 10. The resistance value when the magnetization directions of the first ferromagnetic layer 1 and the second ferromagnetic layer 2 were parallel and the magnetization directions of the resistance value when the first ferromagnetic layer 1 and the second ferromagnetic layer 2 were antiparallel were measured and the MR ratio was calculated by the following formula from the obtained resistance values. The MR ratio was measured at 300K (room temperature).

$$MR\ ratio\ (\%) = (R_{AP} - R_P)/R_P \times 100$$

$R_P$ denotes the resistance value when the magnetization directions of the first ferromagnetic layer 1 and the second ferromagnetic layer 2 are parallel and $R_{AP}$ denotes the resistance value when the magnetization directions of the first ferromagnetic layer 1 and the second ferromagnetic layer 2 are antiparallel.

RA was obtained from the product of the resistance $R_P$ when the magnetization directions of the first ferromagnetic layer 1 and the second ferromagnetic layer 2 were parallel and the area A of the magnetoresistance effect element 10 in the in-plane direction.

The magnetoresistance effect element 10 according to Example 1 has an MR ratio of 10.8% and an RA of 0.06 $\Omega \cdot \mu m^2$.

Examples 2 to 15

Examples 2 to 15 are different from Example 1 in that the first atom is changed. Then, the MR ratio and RA of the magnetoresistance effect element 10 were measured in the same order as Example 1. Further, it was confirmed that the first atom was contained in the first layer 1A and the third layer 2A by performing composition analysis of the first layer 1A and the third layer 2A after annealing.

In Example 2, Al was used as the first atom.
In Example 3, Cr was used as the first atom.
In Example 4, Mn was used as the first atom.
In Example 5, Ni was used as the first atom.
In Example 6, Cu was used as the first atom.
In Example 7, Zn was used as the first atom.
In Example 8, Pd was used as the first atom.
In Example 9, Cd was used as the first atom.
In Example 10, In was used as the first atom.
In Example 11, Sn was used as the first atom.
In Example 12, Sb was used as the first atom.
In Example 13, Pt was used as the first atom.
In Example 14, Au was used as the first atom.
In Example 15, Bi was used as the first atom.

Example 16

Example 16 is different from Example 1 in that the manufactured magnetoresistance effect element is the magnetoresistance effect element 11 shown in FIG. 4. The fifth layer 1C had $(Co_{0.5}Fe_{0.5})_{0.9}Zn_{0.1}$ similarly to the first layer 1A. The MR ratio and RA of the magnetoresistance effect element 10 were measured while other conditions were the same as in Example 1. Further, it was confirmed that Zn was contained as the first atom in the fifth layer 1C by performing composition analysis of the fifth layer 1C after annealing.

Example 17

Example 17 is different from Example 1 in that the manufactured magnetoresistance effect element is the magnetoresistance effect element 13 shown in FIG. 6. In Example 17, NiAl was deposited to a thickness of 0.24 nm between the first ferromagnetic layer 1 and the nonmagnetic layer 3 and between the second ferromagnetic layer 2 and the nonmagnetic layer 3. The MR ratio and RA of the magnetoresistance effect element 10 were measured while other conditions were the same as in Example 7.

Comparative Example 1

Comparative Example 1 is different from Example 1 in that Mg corresponding to the first atom was not contained when forming the first layer 1A and the third layer 2A. That is, none of the first layer 1A, the second layer 1B, the third layer 2A, and the fourth layer 2B of the magnetoresistance effect element of Comparative Example 1 contained the first atom. The MR ratio and RA of the magnetoresistance effect element 10 were measured while other conditions were the same as in Example 1.

Table 1 shows the measurement results of Examples 1 to 17 and Comparative Example 1.

TABLE 1

| | FIRST ATOM | FIFTH LAYER | NiAl LAYER | MR RATIO (%) | RA ($\Omega \cdot \mu m^2$) |
|---|---|---|---|---|---|
| EXAMPLE 1 | Mg | No | No | 10.8 | 0.06 |
| EXAMPLE 2 | Al | No | No | 13.0 | 0.06 |
| EXAMPLE 3 | Cr | No | No | 16.8 | 0.07 |
| EXAMPLE 4 | Mn | No | No | 17.2 | 0.08 |
| EXAMPLE 5 | Ni | No | No | 17.4 | 0.06 |
| EXAMPLE 6 | Cu | No | No | 17.5 | 0.06 |
| EXAMPLE 7 | Zn | No | No | 17.6 | 0.08 |
| EXAMPLE 8 | Pd | No | No | 14.8 | 0.07 |
| EXAMPLE 9 | Cd | No | No | 11.9 | 0.06 |
| EXAMPLE 10 | In | No | No | 12.1 | 0.06 |
| EXAMPLE 11 | Sn | No | No | 11.5 | 0.07 |
| EXAMPLE 12 | Sb | No | No | 11.2 | 0.07 |
| EXAMPLE 13 | Pt | No | No | 10.1 | 0.07 |
| EXAMPLE 14 | Au | No | No | 8.1 | 0.06 |
| EXAMPLE 15 | Bi | No | No | 7.2 | 0.08 |
| EXAMPLE 16 | Zn | YES | No | 17.8 | 0.09 |
| EXAMPLE 17 | Zn | No | YES | 18.3 | 0.08 |
| COMPARATIVE EXAMPLE 1 | — | No | No | 5.5 | 0.06 |

EXPLANATION OF REFERENCES

1 First ferromagnetic layer
1A First layer
1B Second layer
1C Fifth layer
2 Second ferromagnetic layer
2A Third layer
2B Fourth layer
3 Nonmagnetic layer
4 NiAl layer
5 NiAl layer
8 Spin-orbit torque wiring
10 Magnetoresistance effect element
21 Resistance tester
22 Power source
23 Measurement section
26 DC power source
27 Inductor
28 Capacitor
29 Output port
30, 31 Wiring
100, 101, 102 Magnetic recording element
103 High-frequency device

What is claimed is:
1. A magnetoresistance effect element comprising:
a first ferromagnetic layer;
a second ferromagnetic layer; and
a nonmagnetic layer,
wherein the first ferromagnetic layer includes a first layer and a second layer,
wherein the first layer is closer to the nonmagnetic layer than the second layer,
wherein the first layer has a Heusler alloy containing at least partially crystallized Co,
wherein the second layer contains a material different from the Heusler alloy and has at least a partially crystallized ferromagnetic material, wherein the first layer and the second layer have added first atoms, and wherein the first atom is any one selected from the group consisting of Mg, Al, Cr, Mn, Ni, Cu, Zn, Pd, Cd, In, Sn, Sb, Pt, Au, and Bi.

2. The magnetoresistance effect element according to claim 1, wherein the second ferromagnetic layer includes a third layer and a fourth layer, wherein the third layer is closer to the nonmagnetic layer than the fourth layer, wherein the third layer has a Heusler alloy containing at least partially crystallized Co, wherein the fourth layer contains a material different from the Heusler alloy and has at least a partially crystallized ferromagnetic material, and wherein the third layer and the fourth layer have the first atoms.

3. The magnetoresistance effect element according to claim 1, wherein the first ferromagnetic layer further includes a fifth layer, wherein the first layer and the fifth layer sandwich the second layer, and wherein the fifth layer has the Heusler alloy.

4. The magnetoresistance effect element according to claim 1, wherein the ferromagnetic material is represented by $Co_xFe_{1-x}$-A, and wherein x is 0 or more and 1 or less and A is the first atom.

5. The magnetoresistance effect element according to claim 1, wherein a crystal structure of the ferromagnetic material is a bcc structure or fcc structure.

6. The magnetoresistance effect element according to claim 1, wherein the first layer and the second layer are close to each other, wherein the first layer and the second layer are lattice-matched, and wherein a lattice constant of the first layer is 95% or more and 105% or less of a lattice constant of the second layer when the lattice constant of the second layer is used as a reference.

7. The magnetoresistance effect element according to claim 1, wherein a first surface of the first layer on the side of the nonmagnetic layer has a lower concentration of the first atoms than a second surface on the side opposite to the first surface.

8. The magnetoresistance effect element according to claim 1, wherein a concentration of the first atoms in the first layer is lower than a concentration of the first atoms in the second layer.

9. The magnetoresistance effect element according to claim 1, wherein a crystal structure of the Heusler alloy is an $L2_1$ structure or B2 structure.

10. The magnetoresistance effect element according to claim 1, wherein a Co composition ratio of the Heusler alloy is less than a stoichiometric composition ratio, wherein the Heusler alloy is represented by CoYZ or $Co_2YZ$ in stoichiometric composition, wherein Y is a transition metal of a Mn, V, Cr, or Ti group, a transition metal element of a Co, Fe, Ni, or Cu group, or a noble metal element, and wherein Z is a typical element of group III to group V.

11. The magnetoresistance effect element according to claim 10, wherein the Heusler alloy is represented by $Co_2Y_\alpha Z_\beta$ in composition formula, wherein the Y is one or more elements selected from the group consisting of Fe, Mn, and Cr, wherein the Z is one or more elements selected from the group consisting of Si, Al, Ga, and Ge, and wherein $\alpha+\beta>2$ is satisfied.

12. The magnetoresistance effect element according to claim 1, wherein the first atom is substituted with a part of a crystal structure of the Heusler alloy.

13. The magnetoresistance effect element according to claim 1, further comprising:

a NiAl alloy layer which is located in at least one of a position between the first ferromagnetic layer and the nonmagnetic layer and a position between the second ferromagnetic layer and the nonmagnetic layer.

14. The magnetoresistance effect element according to claim 13, wherein the NiAl alloy layer has a thickness of 0.63 nm or less.

15. The magnetoresistance effect element according to claim 1, wherein the nonmagnetic layer is a metal or alloy containing any element selected from the group consisting of Cu, Au, Ag, Al, and Cr.

16. The magnetoresistance effect element according to claim 1, further comprising:

a substrate, wherein the substrate is a base on which the first ferromagnetic layer, the second ferromagnetic layer, and the nonmagnetic layer are laminated, and wherein the substrate is amorphous.

17. A magnetic recording element comprising:

a magnetic head which includes the magnetoresistance effect element according to claim 1; and a magnetic recording medium.

18. A high-frequency device comprising:

the magnetoresistance effect element according to claim 1.

* * * * *